(12) United States Patent
Kurihashi et al.

(10) Patent No.: US 11,110,909 B2
(45) Date of Patent: Sep. 7, 2021

(54) CONTROL DEVICE OF HYBRID VEHICLE

(71) Applicant: TOYOTA JIDOSHA KABUSHIKI KAISHA, Toyota (JP)

(72) Inventors: Sui Kurihashi, Sunto-gun (JP);
Yoshiyuki Kageura, Sunto-gun (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 308 days.

(21) Appl. No.: 16/353,577

(22) Filed: Mar. 14, 2019

(65) Prior Publication Data
US 2019/0322270 A1  Oct. 24, 2019

(30) Foreign Application Priority Data

Apr. 19, 2018 (JP) .............................. JP2018-080857

(51) Int. Cl.
| | | |
|---|---|---|
| B60W 20/20 | (2016.01) | |
| G01R 31/371 | (2019.01) | |
| G01R 31/382 | (2019.01) | |
| G05D 1/02 | (2020.01) | |
| G08G 1/0968 | (2006.01) | |

(52) U.S. Cl.
CPC ............ B60W 20/20 (2013.01); G01R 31/371 (2019.01); G01R 31/382 (2019.01); G05D 1/0217 (2013.01); G08G 1/096833 (2013.01)

(58) Field of Classification Search
CPC ...... B60W 20/00; B60W 20/10; B60W 20/11; B60W 20/12; B60W 20/13; B60W 20/14; B60W 20/16; B60W 20/20; B60W 20/40; B60W 30/18; G01R 31/382; G01R 31/371; G05D 1/02; G05D 1/021; G05D 1/0217; G05D 1/0276; G05D 1/0291; G05D 1/0223; G05D 2201/00; G05D 2201/02; G05D 3/00; G08G 1/096833; F02D 2200/00; F02D 2200/702; F02N 11/00; F02N 11/08; F02N 11/0803; F02N 11/0814; F02N 11/0818; F02N 11/0837; Y10S 903/93
USPC .......................................................... 700/1
See application file for complete search history.

(56) References Cited

FOREIGN PATENT DOCUMENTS

| | | | |
|---|---|---|---|
| JP | 2010-280379 A | | 12/2010 |
| JP | 2010280379 A | * | 12/2010 |
| JP | 2013-159214 A | | 8/2013 |
| JP | 2014-162261 A | | 9/2014 |
| JP | 2014-213638 A | | 11/2014 |
| JP | 2014213638 A | * | 11/2014 |

* cited by examiner

*Primary Examiner* — Anthony R Jimenez
(74) *Attorney, Agent, or Firm* — Oliff PLC

(57) ABSTRACT

A control device of a hybrid vehicle 1, 1' comprises a driving plan generating part 61 setting a driving mode, an output control part 62 controlling outputs of the internal combustion engine 40 and the motor 16, and a lower limit value setting part 63 setting a lower limit value of a state of charge of the battery. The driving plan generating part divides a plurality of routes into pluralities of sections, and sets driving modes of all sections of at least one route to an EV mode. If an actual state of charge of the battery becomes lower than the lower limit value, the output control part changes the driving mode so that the actual state of charge is maintained or becomes higher. The lower limit value setting part lowers the lower limit value at an EV route, compared with a non-EV route other than the EV route.

5 Claims, 20 Drawing Sheets

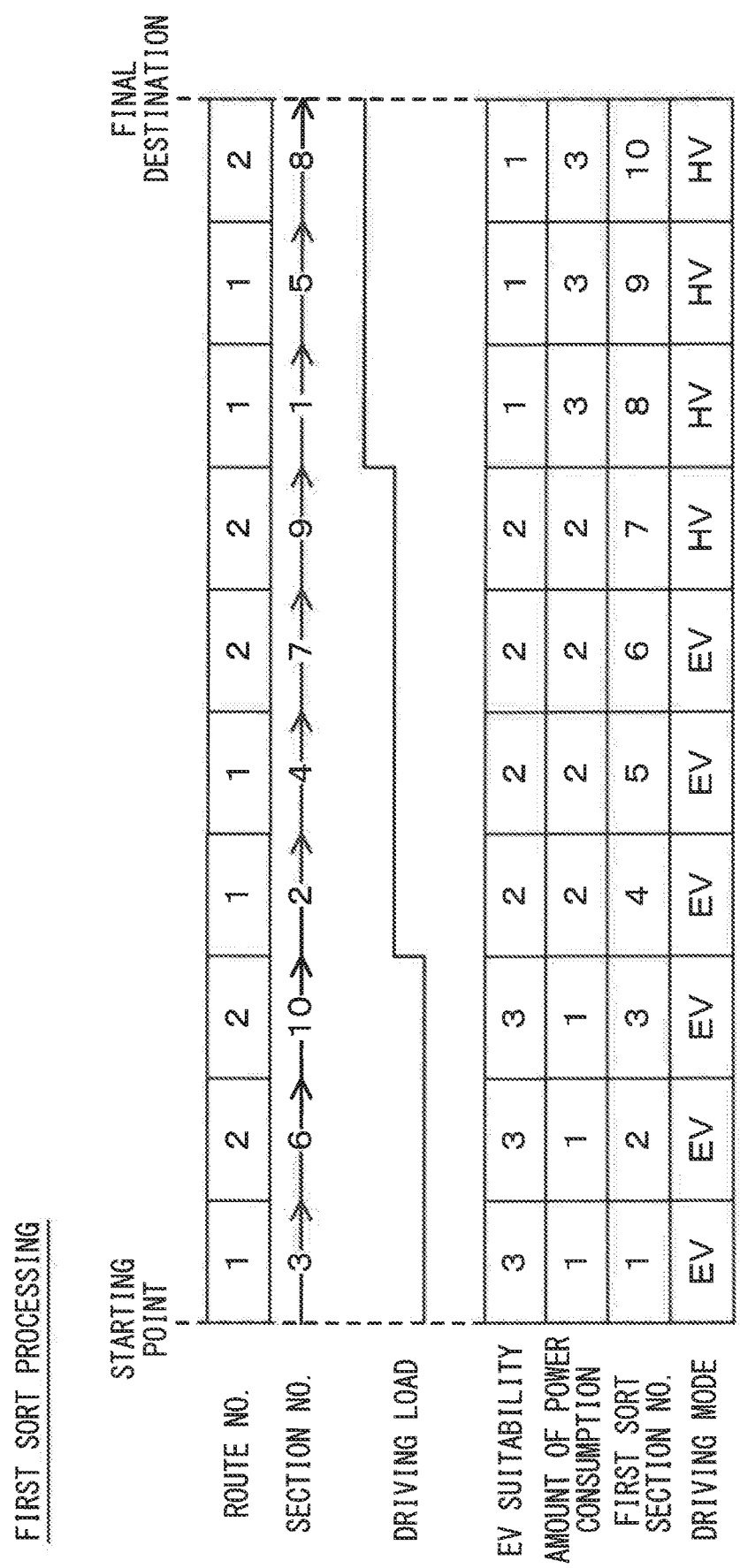

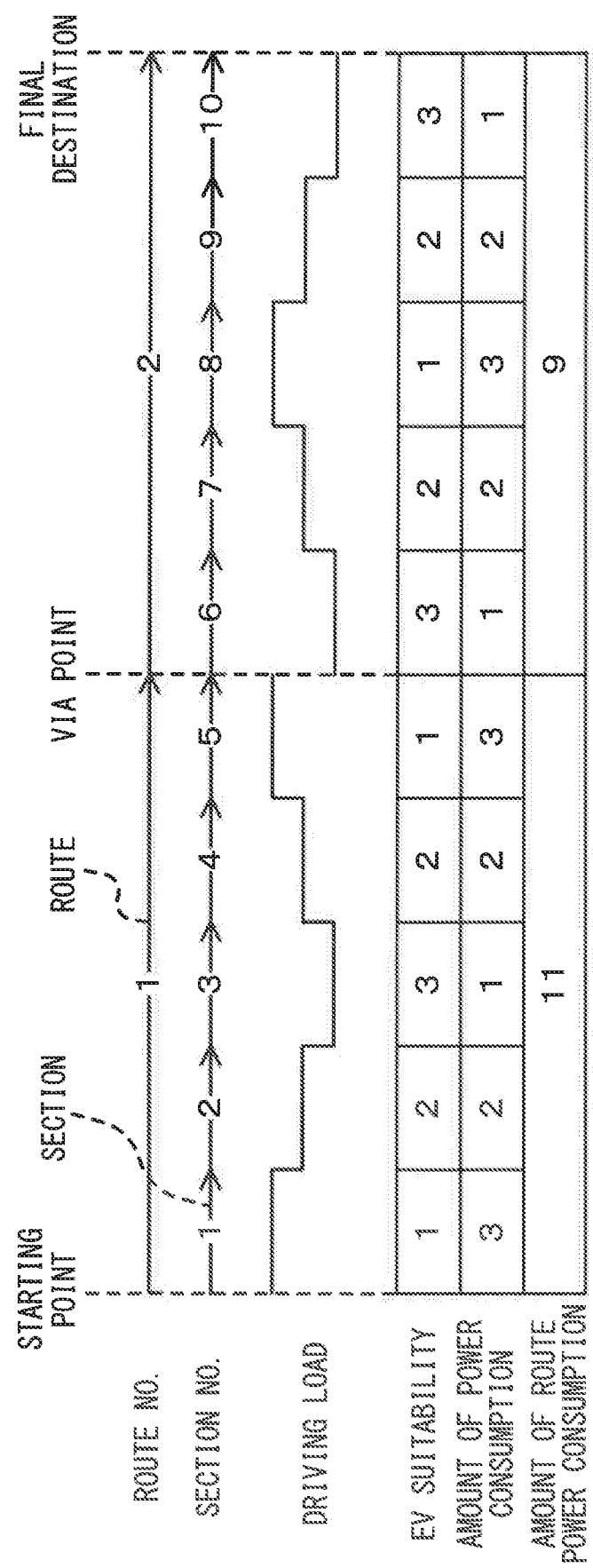

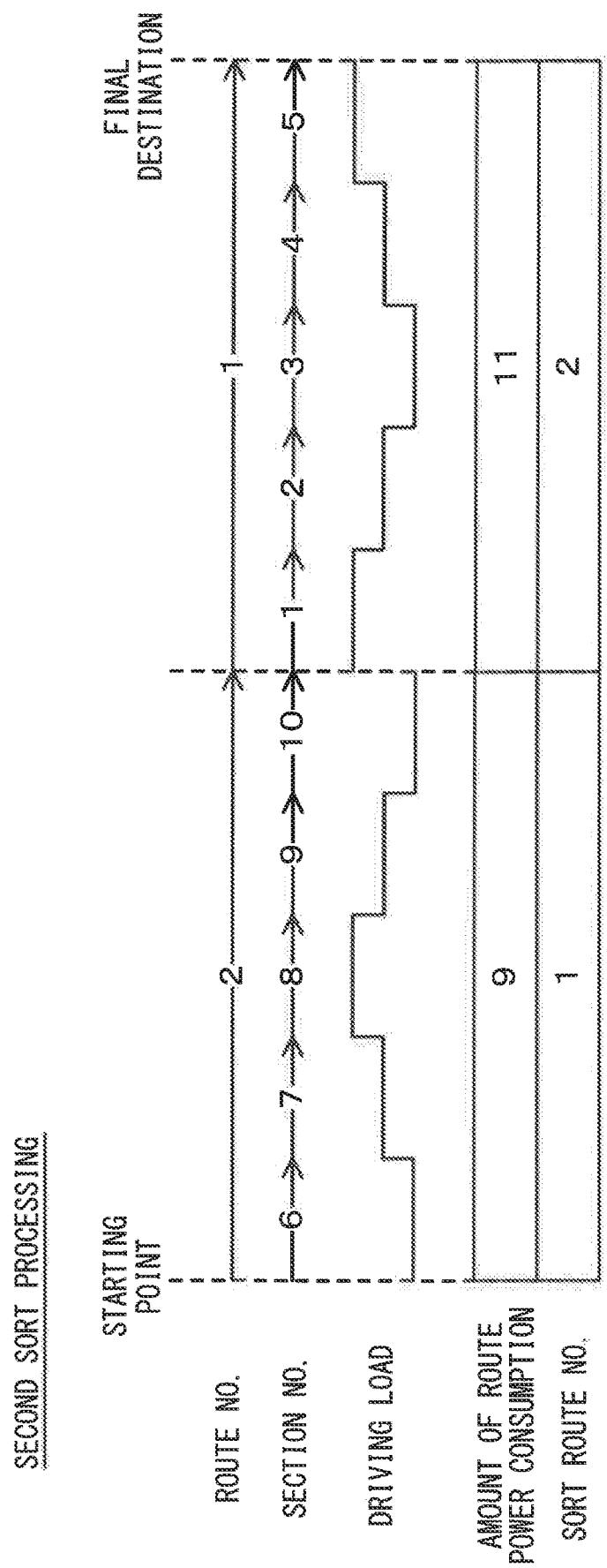

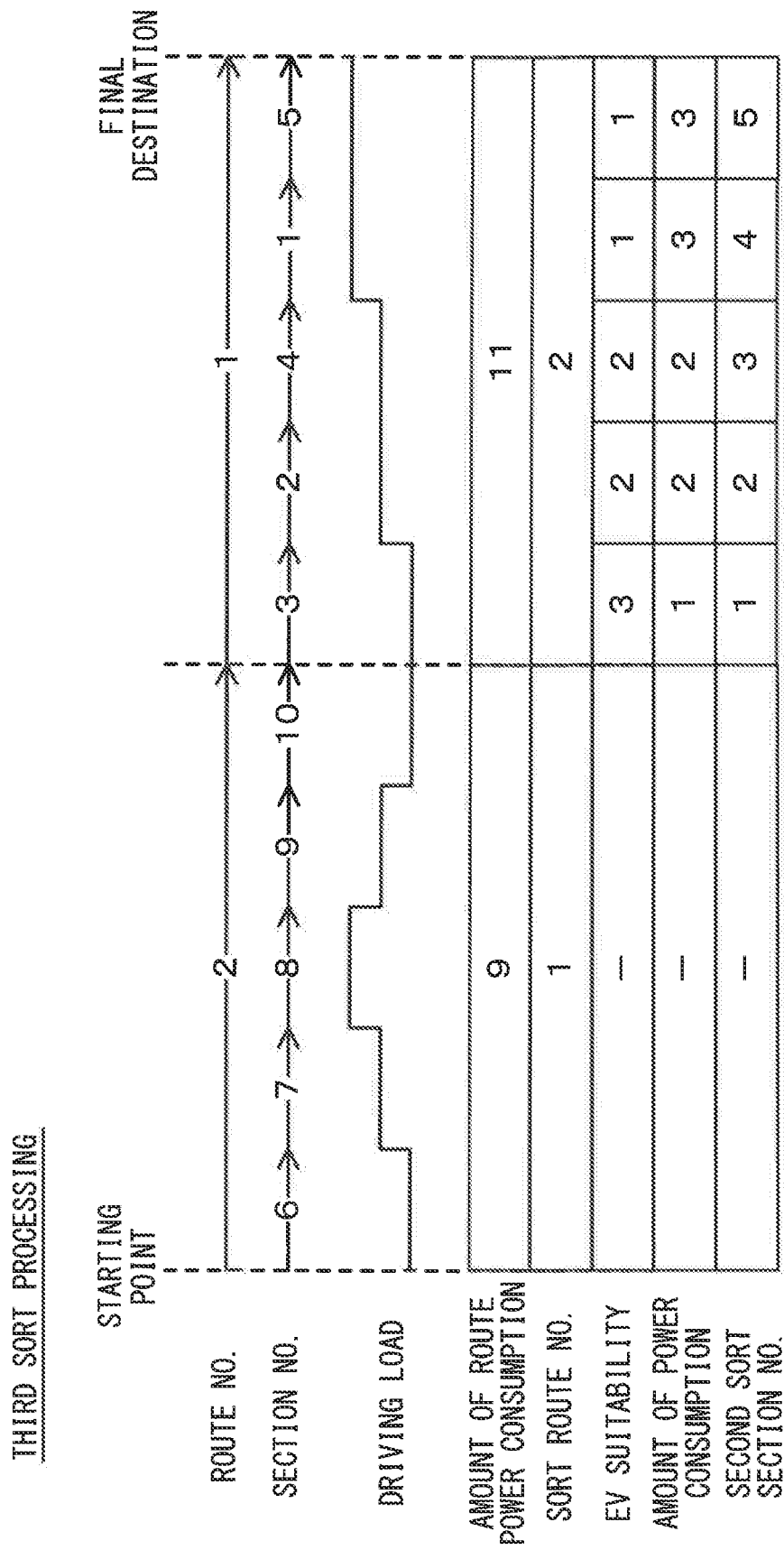

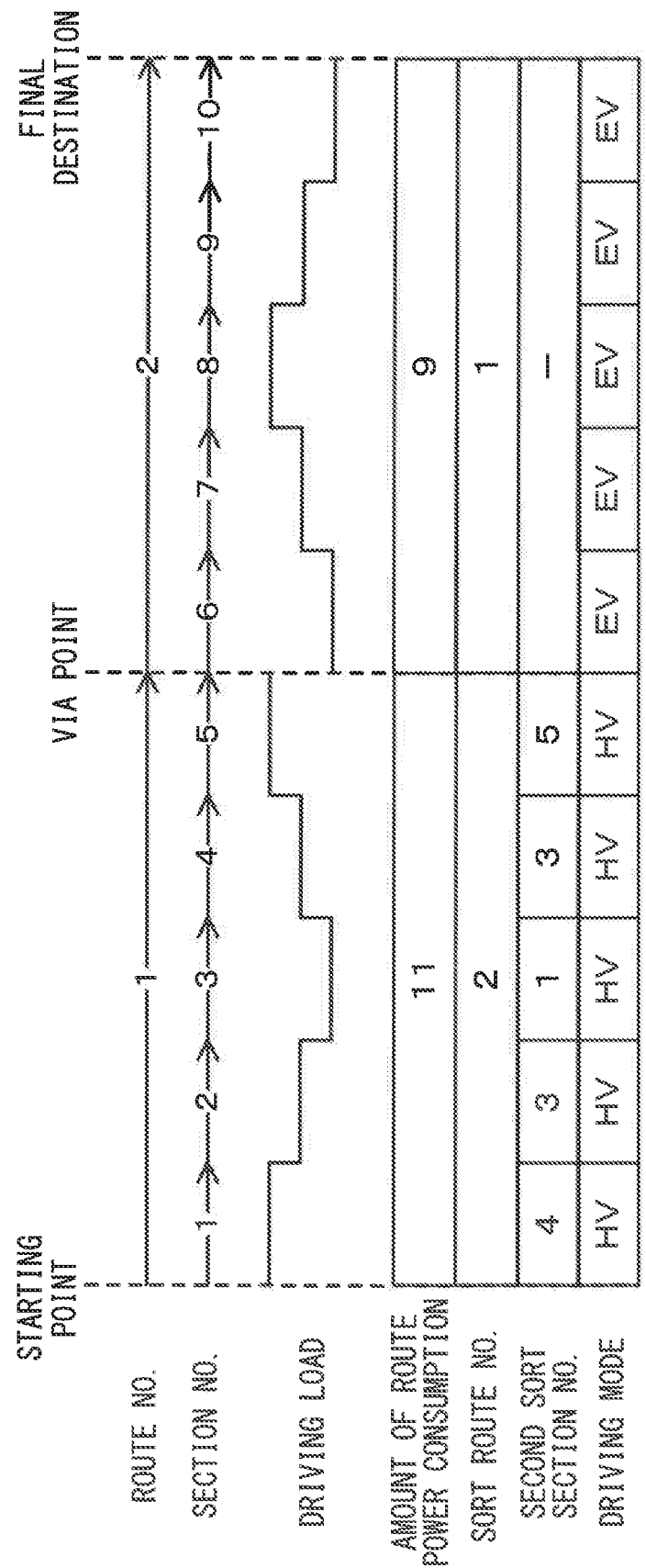

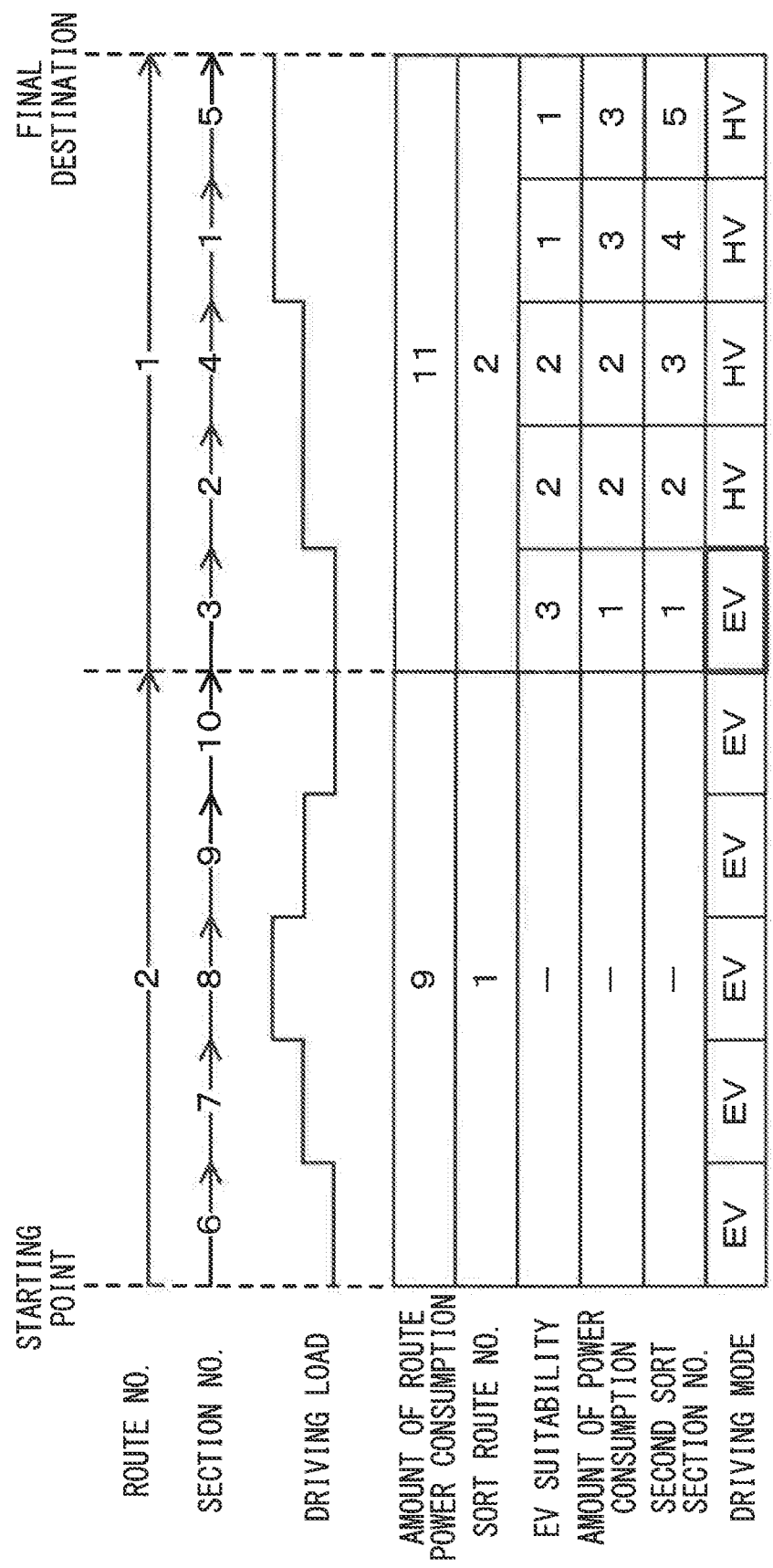

FIG. 6

| ROUTE NO. | | →1→ | | →2→ | | →3→ | | | →4→ | |
|---|---|---|---|---|---|---|---|---|---|---|
| | SECTION NO. | 1 | 2 | 3 | 4 | 5 | 6 | 7 | 8 | 9 | 10 |
| | AMOUNT OF POWER CONSUMPTION | 1 | 1 | 2 | 3 | 3 | 1 | 1 | 1 | 2 | 1 |
| | AMOUNT OF ROUTE POWER CONSUMPTION | 2 | | 5 | | | 6 | | | 3 | |
| | EV ALLOCATION ORDER | 1 | 2 | 3 | 7 | 10 | 8 | 9 | 4 | 5 | 6 |
| DRIVING PLAN | DRIVING MODE | EV | EV | HV | HV | HV | EV | HV | HV | EV | EV |
| | TARGET SOC | 7 | 6 | 6 | 6 | 6 | 5 | 5 | 5 | 3 | 2 |
| | AMOUNT OF DRIVING FUEL CONSUMPTION | 0 | 0 | 2.5 | 3 | 3 | 0 | 2 | 2 | 0 | 0 |
| | AMOUNT OF WARM-UP FUEL CONSUMPTION | 0 | 0 | 2 | 0 | 2 | 0 | 0 | 0 | 0 | 0 |
| | AMOUNT OF CUMULATIVE FUEL CONSUMPTION | 0 | 0 | 4.5 | 7.5 | 12.5 | 12.5 | 14.5 | 16.5 | 16.5 | 16.5 |
| COMPARATIVE EXAMPLE1 | DRIVING MODE | EV | EV | HV | HV | HV | EV | HV | HV | EV | HV |
| | ACTUAL SOC | 7 | 6 | 6 | 6 | 6 | 5 | 5 | 5 | 2 | 2 |
| | AMOUNT OF DRIVING FUEL CONSUMPTION | 0 | 0 | 2.5 | 3 | 3 | 0 | 2 | 2 | 0 | 2 |
| | AMOUNT OF WARM-UP FUEL CONSUMPTION | 0 | 0 | 2 | 0 | 2 | 0 | 0 | 0 | 0 | 2 |
| | AMOUNT OF CUMULATIVE FUEL CONSUMPTION | 0 | 0 | 4.5 | 7.5 | 12.5 | 12.5 | 14.5 | 16.5 | 16.5 | 20.5 |
| | CUMULATIVE BATTERY DETERIORATION INDEX | 0 | 0 | 0 | 0 | 0 | 0 | 0 | 0 | 0 | 0 |
| COMPARATIVE EXAMPLE2 | DRIVING MODE | EV | EV | EV | EV | RE | RE | RE | RE | EV | RE |
| | ACTUAL SOC | 7 | 6 | 4 | 1 | 1 | 1.67 | 2.33 | 3 | 0 | 0.67 |
| | AMOUNT OF DRIVING FUEL CONSUMPTION | 0 | 0 | 0 | 0 | 3 | 3 | 3 | 3 | 0 | 3 |
| | AMOUNT OF WARM-UP FUEL CONSUMPTION | 0 | 0 | 0 | 0 | 2 | 0 | 0 | 0 | 0 | 2 |
| | AMOUNT OF CUMULATIVE FUEL CONSUMPTION | 0 | 0 | 0 | 0 | 5 | 8 | 11 | 14 | 14 | 19 |
| | CUMULATIVE BATTERY DETERIORATION INDEX | 0 | 0 | 0 | 1 | 2 | 2.1 | 2.1 | 2.1 | 6.1 | 6.9 |
| FIRST EMBODIMENT | DRIVING MODE | EV | EV | HV | HV | HV | EV | HV | HV | EV | EV |
| | ACTUAL SOC | 7 | 6 | 6 | 6 | 6 | 5 | 5 | 5 | 2 | 1 |
| | AMOUNT OF DRIVING FUEL CONSUMPTION | 0 | 0 | 2.5 | 3 | 3 | 0 | 2 | 2 | 0 | 0 |
| | AMOUNT OF WARM-UP FUEL CONSUMPTION | 0 | 0 | 2 | 0 | 2 | 0 | 0 | 0 | 0 | 0 |
| | AMOUNT OF CUMULATIVE FUEL CONSUMPTION | 0 | 0 | 4.5 | 7.5 | 12.5 | 12.5 | 14.5 | 16.5 | 16.5 | 16.5 |
| | CUMULATIVE BATTERY DETERIORATION INDEX | 0 | 0 | 0 | 0 | 0 | 0 | 0 | 0 | 0 | 1 |

CONTROL DEVICE OF HYBRID VEHICLE

FIELD

The present invention relates to a control device of a hybrid vehicle.

BACKGROUND

Known in the past has been a hybrid vehicle provided with an internal combustion engine, a motor, and a battery supplying electric power to the motor and able to be charged by output of the internal combustion engine. In such a hybrid vehicle, an EV mode in which drive use power is output by only the motor can be selected as the driving mode.

In the EV mode, the internal combustion engine is stopped, so by setting the driving mode to the EV mode, it is possible to improve the fuel efficiency of the hybrid vehicle. In the hybrid vehicle described in PTL 1, a route until the destination is divided in a plurality of sections and the driving modes in sections with a high EV suitability are preferentially set to the EV mode.

CITATIONS LIST

Patent Literature

[PTL 1] Japanese Unexamined Patent Publication No. 2014-162261A

SUMMARY

Technical Problem

In this regard, if the hybrid vehicle is driven from a starting point through a via point to a final destination, often the temperature of the internal combustion engine will fall while the vehicle is stopped at the via point. If the temperature of the internal combustion engine falls, a catalyst has to be warmed up at the time of restart of the internal combustion engine and fuel is excessively consumed for warming up the catalyst.

For this reason, even if the ratio by which the EV mode is selected as the driving mode is made higher, if the number of times of warm-up of the catalyst is high, sometimes the fuel efficiency deteriorates. However, in the hybrid vehicle described in PTL 1, the fuel consumed for warming up the catalyst is not considered at all when selecting of the driving modes at the sections.

Therefore, in consideration of the above problem, an object of the present invention is to reduce the number of times of warm-up of a catalyst provided in an exhaust passage of an internal combustion engine when a hybrid vehicle is being driven from a starting point through a via point to a final destination.

Solution to Problem

The summary of the present disclosure is as follows.

(1) A control device of a hybrid vehicle for controlling a hybrid vehicle comprising an internal combustion engine in which a catalyst is provided in an exhaust passage, a motor, and a battery supplying electric power to the motor and able to be charged by output of the internal combustion engine, the control device of a hybrid vehicle comprising: a driving plan generating part configured to set in advance a driving mode when the hybrid vehicle is being driven; an output control part configured to control outputs of the internal combustion engine and the motor based on the driving mode; and a lower limit value setting part configured to set a lower limit value of a state of charge of the battery, wherein if the hybrid vehicle is being driven from a departure point through at least one via point to a final destination, the driving plan generating part is configured to divide a plurality of routes each having a via point as at least one of a starting point and an end point into pluralities of sections, and set driving modes of all sections of at least one route to an EV mode in which the internal combustion engine is stopped and drive use power is output by only the motor, if an actual state of charge of the battery becomes lower than the lower limit value, the output control part is configured to change the driving mode set by the driving plan generating part so that the actual state of charge is maintained or becomes higher, and the lower limit value setting part is configured to lower the lower limit value at an EV route where the driving modes of all of the sections are set to the EV mode, compared with a non-EV route other than the EV route.

(2) The control device of a hybrid vehicle described in above (1), the lower limit value setting part is configured to lower the lower limit value at the EV route only if the actual state of charge does not reach a reference value when the driving mode is maintained at the EV mode at the EV route, and the reference value is lower than the lower limit value at the non-EV route.

(3) The control device of a hybrid vehicle described in above (1) or (2), wherein the lower limit value setting part is configured to lower the lower limit value only at the EV route closest to the final destination.

Advantageous Effects of Invention

According to the present invention, it is possible to reduce the number of times of warm-up of a catalyst provided in an exhaust passage of an internal combustion engine when a hybrid vehicle is being driven from a starting point through a via point to a final destination.

BRIEF DESCRIPTION OF DRAWINGS

FIG. 4B is a view for explaining generation of the first driving plan.

FIG. 5A is a view for explaining generation of a second driving plan.

FIG. 5B is a view for explaining generation of the second driving plan.

FIG. 5C is a view for explaining generation of the second driving plan.

FIG. 5E is a view for explaining generation of the second driving plan.

FIG. 5F is a view for explaining generation of the second driving plan.

FIG. 6 is a view showing a specific example of control in the first embodiment of the present invention together with a comparative example.

DESCRIPTION OF EMBODIMENTS

Figure 1:
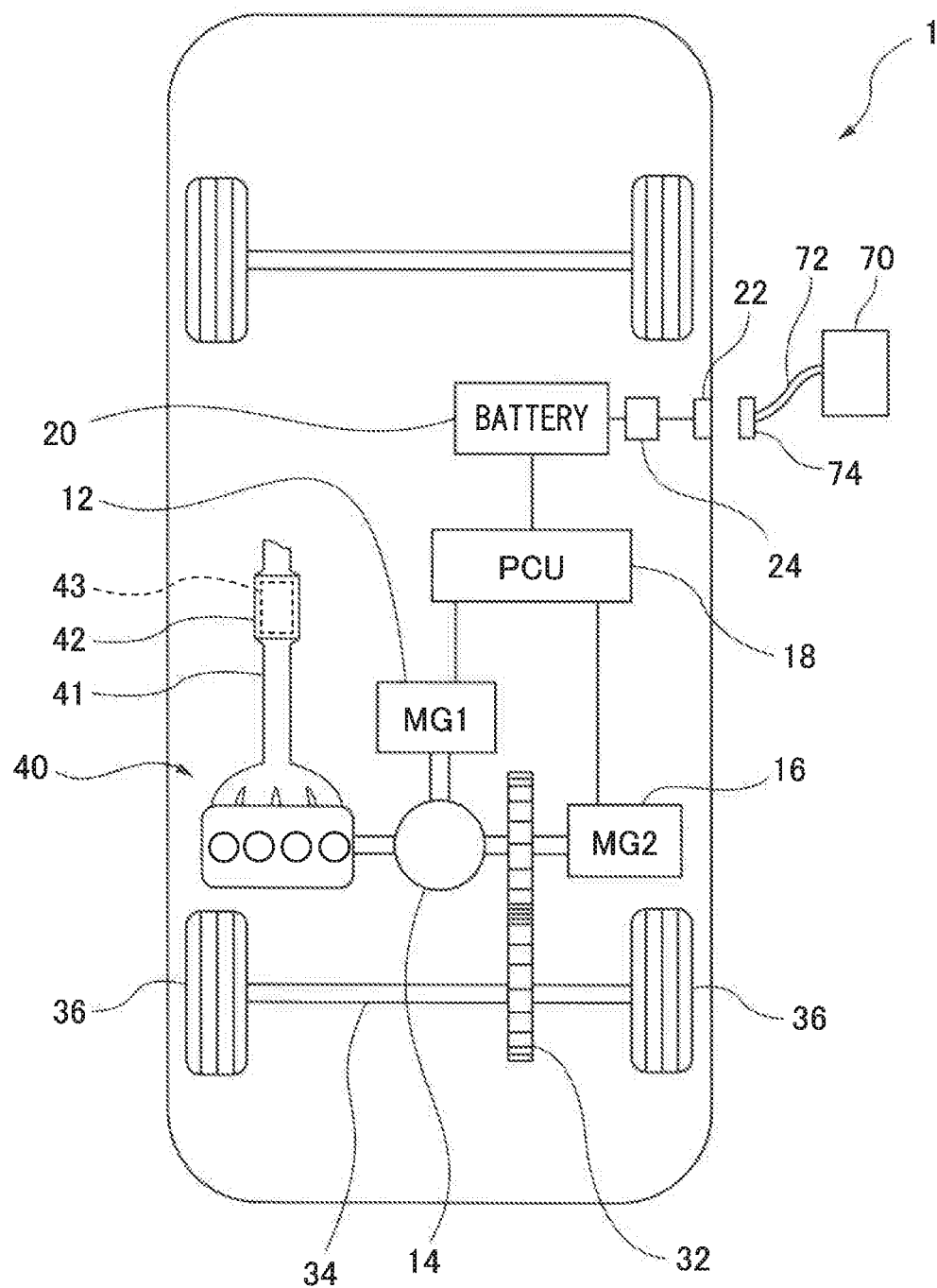
FIG. 1 is a view schematically showing the configuration of a hybrid vehicle according to a first embodiment of the present invention.

Below, referring to the drawings, embodiments of the present invention will be explained in detail. Note that, in the following explanation, similar components are assigned the same reference signs.

First Embodiment

Below, referring to FIG. 1 to FIG. 8, a first embodiment of the present invention will be explained.

<Configuration of Hybrid Vehicle>

FIG. 1 is a view schematically showing the configuration of a hybrid vehicle 1 according to the first embodiment of the present invention. A hybrid vehicle (below, simply referred to as the "vehicle") 1 is provided with an internal combustion engine 40, first motor-generator 12, power distributing mechanism 14, second motor-generator 16, power control unit (PCU) 18, and battery 20.

The internal combustion engine 40 makes a mixture of fuel and air burn in a cylinder to output drive power. The internal combustion engine 40 is, for example, a gasoline engine or diesel engine. In the exhaust passage 41 of the internal combustion engine 40, a catalyst 43 housed in a casing 42 is provided. The catalyst 43 is, for example, a three-way catalyst, $NO_X$ storage and reduction catalyst, selective reduction type $NO_X$ reducing catalyst (SCR catalyst), etc. The output shaft (crankshaft) of the internal combustion engine 40 is mechanically connected to a power dividing mechanism 14. The output of the internal combustion engine 40 is input to the power dividing mechanism 14.

The first motor-generator 12 functions as a generator and motor. The first motor-generator 12 is mechanically connected to the power distributing mechanism 14, and the output of the first motor-generator 12 is input to the power distributing mechanism 14. Further, the first motor-generator 12 is electrically connected to the PCU 18. When the first motor-generator 12 functions as a generator, the electric power generated by the first motor-generator 12 is supplied through the PCU 18 to at least one of the second motor-generator 16 and battery 20. On the other hand, when the first motor-generator 12 functions as a motor, the electric power stored in the battery 20 is supplied through the PCU 18 to the first motor-generator 12.

The power distributing mechanism 14 is configured as a known planetary gear mechanism including a sun gear, ring gear, pinion gears, and a planetary carrier. The output shaft of the internal combustion engine 40 is coupled with the planetary carrier, the first motor-generator 12 is coupled with the sun gear, and a speed reducer 32 is coupled with the ring gear. The power distributing mechanism 14 distributes the output of the internal combustion engine 40 to the first motor-generator 12 and the speed reducer 32.

Specifically, when the first motor-generator 12 functions as a generator, the output of the internal combustion engine 40 input to the planetary carrier is distributed to the sun gear coupled with the first motor-generator 12 and the ring gear coupled with the speed reducer 32 in accordance with the gear ratio. The output of the internal combustion engine 40 distributed to the first motor-generator 12 is used to generate electric power by the first motor-generator 12. On the other hand, the output of the internal combustion engine 40 distributed to the speed reducer 32 is transmitted as power for driving use through an axle 34 to the wheels 36. Therefore, the internal combustion engine 40 can output power for driving use. Further, when the first motor-generator 12 functions as a motor, the output of the first motor-generator 12 is supplied through the sun gear and planetary carrier to the output shaft of the internal combustion engine 40 whereby the internal combustion engine 40 is cranked.

The second motor-generator 16 functions as a generator and motor. The second motor-generator 16 is mechanically connected to the speed reducer 32, and the output of the second motor-generator 16 is supplied to the speed reducer 32. The output of the second motor-generator 16 supplied to the speed reducer 32 is transmitted as power for driving use to the wheels 36 through the axle 34. Therefore, the second motor-generator 16 can output power for driving use.

Further, the second motor-generator 16 is electrically connected to the PCU 18. At the time of deceleration of the vehicle 1, due to rotation of the wheels 36, the second motor-generator 16 is driven and the second motor-generator 16 functions as a generator. As a result, so-called regeneration is performed. When the second motor-generator 16 functions as a generator, the regenerative power generated by the second motor-generator 16 is supplied through the PCU 18 to the battery 20. On the other hand, when the second motor-generator 16 functions as a motor, the power stored in the battery 20 is supplied through the PCU 18 to the second motor-generator 16.

The PCU 18 is electrically connected to the first motor-generator 12, second motor-generator 16, and battery 20. The PCU 18 includes an inverter, a booster converter, and a DC-DC converter. The inverter converts DC power supplied from the battery 20 to AC power and converts AC power generated by the first motor-generator 12 or second motor-generator 16 to DC power. The booster converter boosts the voltage of the battery 20 in accordance with need when the power stored in the battery 20 is supplied to the first motor-generator 12 or the second motor-generator 16. The DC-DC converter lowers the voltage of the battery 20 when the electric power stored in the battery 20 is supplied to the headlights or other electronic equipment.

The battery 20 is supplied with the electric power generated by the first motor-generator 12 using the output of the internal combustion engine 40 and the regenerative electric power generated by the second motor-generator 16 using the regenerative energy. Therefore, the battery 20 can be charged by the output of the internal combustion engine 40 and the regenerative energy. The battery 20 is for example a lithium ion battery, nickel hydrogen battery, or other secondary battery.

The vehicle 1 is further provided with a charging port 22 and charger 24. The battery 20 can be charged by an external power source 70 as well. Therefore, the vehicle 1 is a so-called "plug-in hybrid vehicle".

The charging port 22 is configured so as to receive the electric power from the external power source 70 through a charging connector 74 of a charging cable 72. When the battery 20 is charged by the external power source 70, the charging connector 74 is connected to the charging port 22. The charger 24 converts the electric power supplied from the external power source 70 to electric power which can be supplied to the battery 20. Note that, the charging port 22 may also be connected to the PCU 18, and the PCU 18 may also function as the charger 24.

<Control Device of Hybrid Vehicle>

Figure 2:
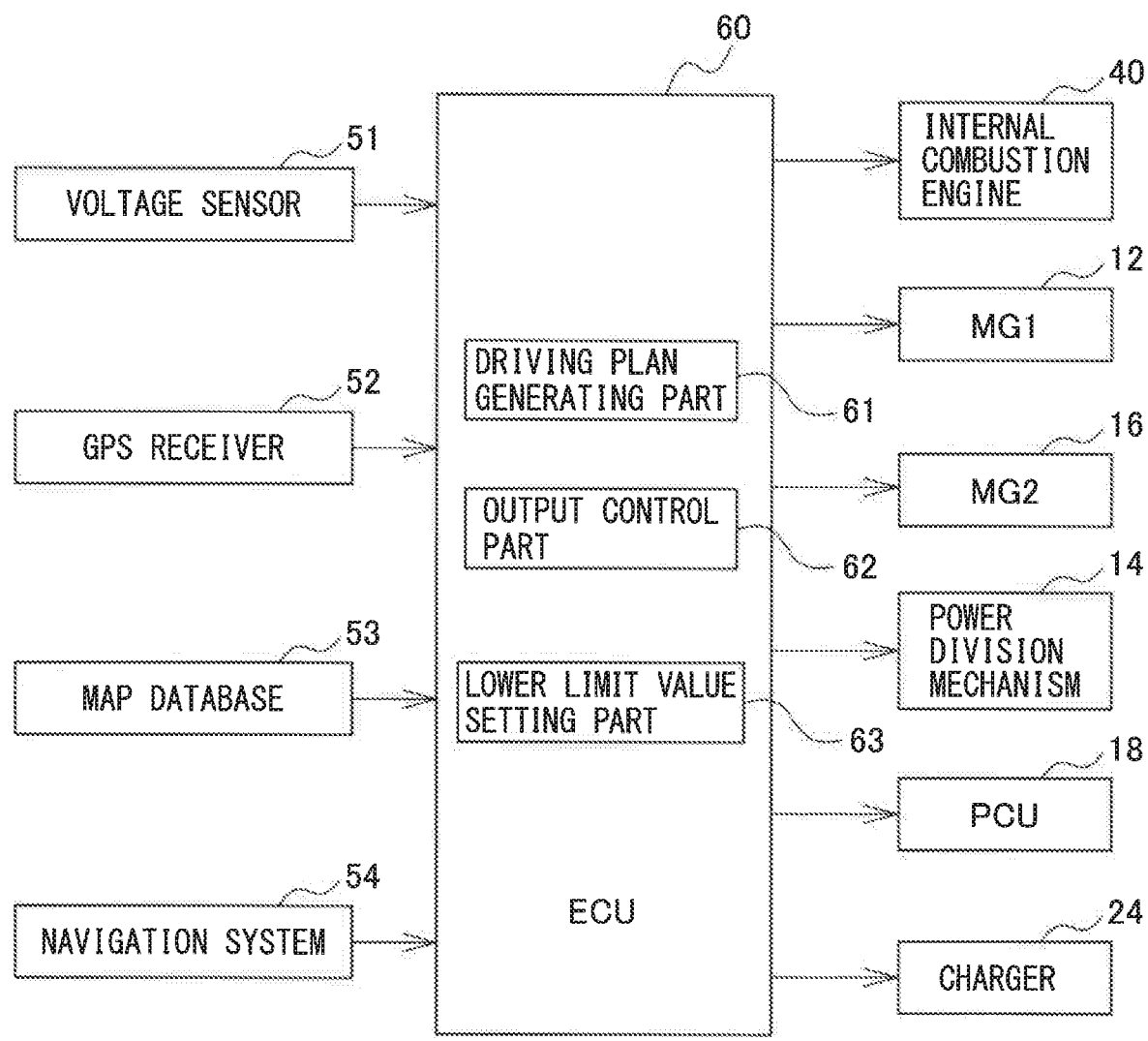
FIG. 2 is a block diagram schematically showing the configuration of a control device of a hybrid vehicle etc., according to the first embodiment of the present invention.

FIG. 2 is a block diagram schematically showing the configuration of a control device etc., of a hybrid vehicle according to a first embodiment of the present invention. The vehicle 1 is provided with an electronic control unit (ECU) 60. The ECU 60 is an electronic control device controlling the vehicle 1. The ECU 60 is provided with a read only memory (ROM) and random access memory (RAM) or other such memory, a central processing unit (CPU), input port, output port, communication module, etc. In the present embodiment, a single ECU 60 is provided, but a plurality of ECUs may be provided for the different functions.

The outputs of various sensors provided at the vehicle 1 are input to the ECU 60. For example, in the present embodiment, the outputs of a voltage sensor 51 and a GPS receiver 52 are input to the ECU 60.

The voltage sensor 51 is provided at the battery 20 and detects the voltage across the electrodes of the battery 20. The voltage sensor 51 is connected to the ECU 60, so the output of the voltage sensor 51 is transmitted to the ECU 60. The ECU 60 calculates the state of charge (SOC: State Of Charge) of the battery 20 based on the output of the voltage sensor 51, etc.

The GPS receiver 52 receives signals from three or more GPS satellites and detects the current position of the vehicle 1 (for example, the longitude and latitude of the vehicle 1). The GPS receiver 52 is connected to the ECU 60, so the output of the GPS receiver 52 is transmitted to the ECU 60.

Further, the ECU 60 is connected to a map database 53 provided at the vehicle 1. The map database 53 is a database relating to the map information. The map information includes road information such as positional information of roads, shape information of roads (for example curved or straight, the radius of curvature of curves, the road gradients, etc.), the types of roads, the speed limits, and other information. The ECU 60 acquires map information from the map database 53.

Further, the ECU 60 is connected to a navigation system 54 provided at the vehicle 1. The navigation system 54 sets the driving route of the vehicle 1 up to the destination based on the current position of the vehicle 1 detected by the GPS receiver 52, the map information of the map database 53, input by the driver, etc. The driving route set by the navigation system 54 is transmitted to the ECU 60. Note that, the GPS receiver 52 and map database 53 may be built into the navigation system 54.

The ECU 60 is connected to the internal combustion engine 40, first motor-generator 12, second motor-generator 16, power dividing mechanism 14, PCU 18, and charger 24, and controls the same. In the present embodiment, the ECU 60 runs programs etc., stored in the memory to thereby function as a driving plan generating part 61, an output control part 62 and a lower limit value setting part 63. Therefore, the control device of the vehicle 1 is provided with the driving plan generating part 61, output control part 62 and lower limit value setting part 63.

The driving plan generating part 61 sets in advance a driving mode and a target SOC of the battery 20 when the vehicle 1 is being driven. The output control part 62 controls the outputs of the internal combustion engine 40 and second motor-generator 16 based on the driving mode. The lower limit value setting part 63 sets a lower limit value of SOC of the battery 20.

The driving plan generating part 61 selects the EV (electric vehicle) mode or HV (hybrid vehicle) mode as the driving mode. In the EV mode, the internal combustion engine 40 is stopped and drive use power is output by only the second motor-generator 16. For this reason, in the EV mode, electric power is supplied from the battery 20 to the second motor-generator 16. As a result, in the EV mode, the amount of electric power of the battery 20 decreases and the SOC of the battery 20 falls. Note that, a one-way clutch transmitting rotational force in only one direction is provided at the power dividing mechanism 14. In the EV mode, drive use power may be output by the first motor-generator 12 and the second motor-generator 16.

On the other hand, in the HV mode, drive use power is output by the internal combustion engine 40 and the second motor-generator 16. In the HV mode, basically, the electric power generated by the first motor-generator 12 using the output of the internal combustion engine 40 is supplied to the second motor-generator 16 and the supply of electric power from the battery 20 is stopped. Note that, in the HV mode, the battery 20 may temporarily be charged by the output of the internal combustion engine 40 or electric power may temporarily be supplied from the battery 20 to the second motor-generator 16. In the HV mode, the amount of electric power and SOC of the battery 20 are maintained substantially constant. Therefore, the degree of drop of the SOC in the EV mode is larger than the degree of drop of the SOC in the HV mode.

In the HV mode, fuel is consumed in the internal combustion engine 40. In the EV mode, fuel is not consumed in the internal combustion engine 40. For this reason, in order to improve the fuel efficiency of the vehicle 1, it is desirable to maintain the driving mode at the EV mode as much as possible. However, if the SOC of the battery 20 is low, it is not possible to set the driving mode to the EV mode. For this reason, if driving the vehicle 1 for a long period of time without charging the battery 20 by the external power supply 70, it is necessary to jointly use the EV mode and HV mode as the driving mode.

The heat efficiency of the internal combustion engine 40 usually becomes lower when the engine load is low. For this reason, at a section with a low driving load, for example, a section with many traffic lights or a section in which congestion easily occurs, it is desirable to set the driving mode to the EV mode and make the internal combustion engine 40 stop. On the other hand, at a section with a high driving load, for example, a highway, ascending slope, etc., it is desirable to set the driving mode to the HV mode.

Further, charging of the battery 20 by the outside power supply 70 is not necessarily performed every one trip (time period from when ignition switch of vehicle 1 is turned on to when it is turned off). For this reason, sometimes several trips are required until the battery 20 is charged by the outside power supply 70 at the final destination (for example home). For example, if going back and forth between the home and workplace, the workplace becomes the via point and two trips are required. Further, if returning from the home to the home through two destinations (shopping center etc.), the destinations become via points and three trips are required.

If the vehicle 1 is driven from the starting point through a via point to the final destination, often the temperature of the internal combustion engine 40 will fall while stopped at the via point. If the temperature of the internal combustion engine 40 falls, the catalyst 43 has to be warmed up at the time of restart of the internal combustion engine 40 and fuel is excessively consumed for warming up the catalyst 43.

For this reason, even if the ratio by which the EV mode is selected as the driving mode is made higher, if the number of times of warm-up of the catalyst 43 is large, sometimes the fuel efficiency deteriorates. Therefore, in the present embodiment, the driving mode is set so that the fuel efficiency of the driving route as a whole is optimized considering also the fuel consumed for warming up the catalyst 43.

Specifically, if the vehicle 1 is driven from the starting point through at least one via point to the final destination, the driving plan generating part 61 divides a plurality of routes having a via point as at least one of the starting point and end point into pluralities of sections, and sets driving modes of all sections of at least one route to an EV mode. In the EV route in which the driving modes of all sections are set to the EV mode, the internal combustion engine 40 is not started up, so the catalyst 43 is not warmed up. For this reason, by setting the driving modes of all sections of at least one route to the EV mode, if the vehicle 1 is driven from the starting point through at least one via point to the final destination, the number of times of warm-up of the catalyst 43 can be reduced.

The driving plan generating part 61 sets the driving mode each of the sections so that the SOC of the battery 20 reaches the lower limit value of the SOC of the battery 20 when the vehicle 1 reaches the final destination. Further, the driving plan generating part 61 calculates the amount of power consumption when the vehicle 1 is driven over the route by the EV mode and sets the driving modes of all sections of the route to the EV mode in the order of the route with the smallest amount of power consumption up. By doing this, it is possible to raise the ratio of the EV routes to all routes of the driven routes and possible to more effectively reduce the number of times the catalyst 43 is warmed up.

<Processing for Generating Driving Plan>

Figure 3A:
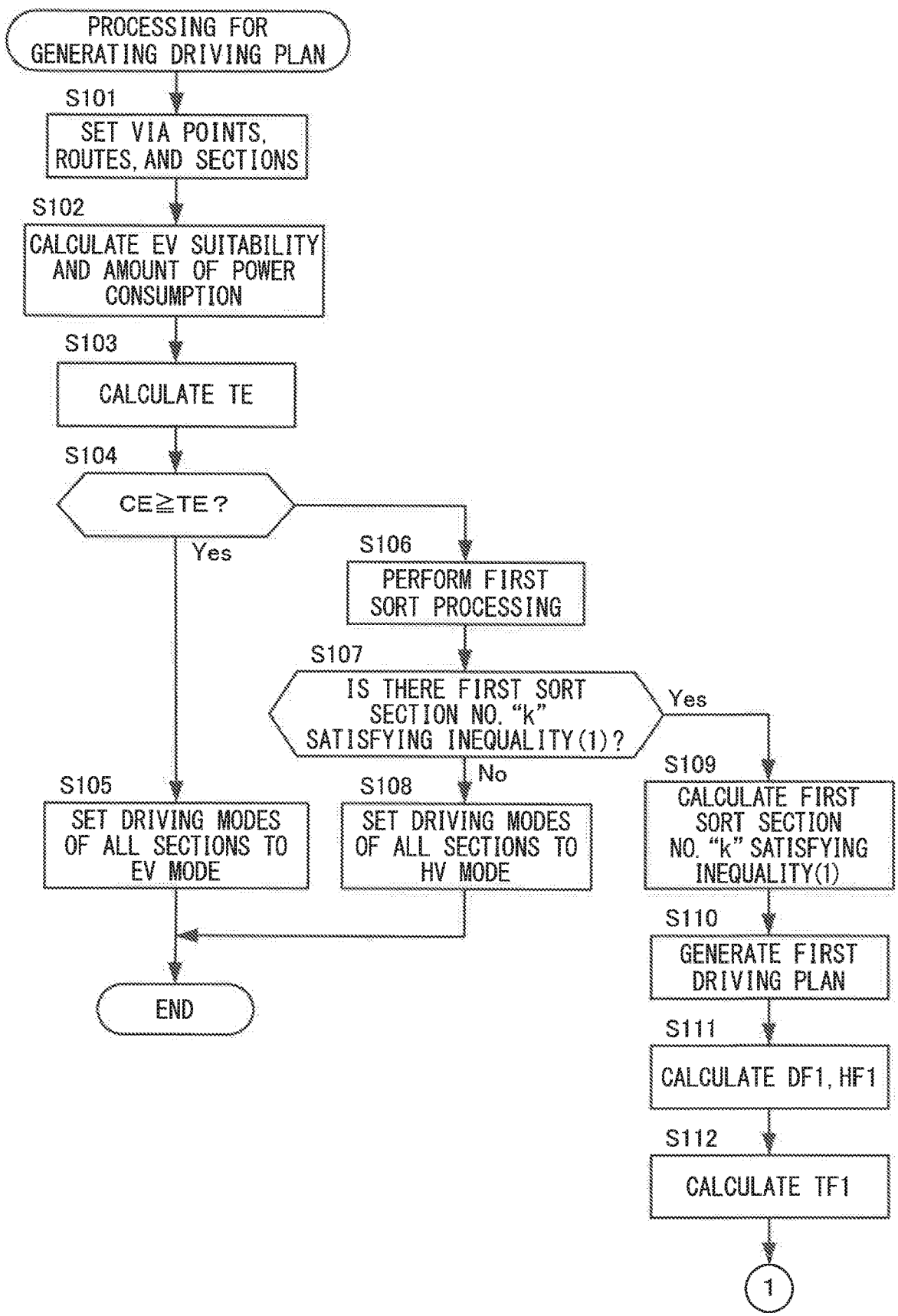
FIG. 3A is a flow chart showing a control routine of processing for generation of a driving plan in the first embodiment of the present invention.
Figure 3B:
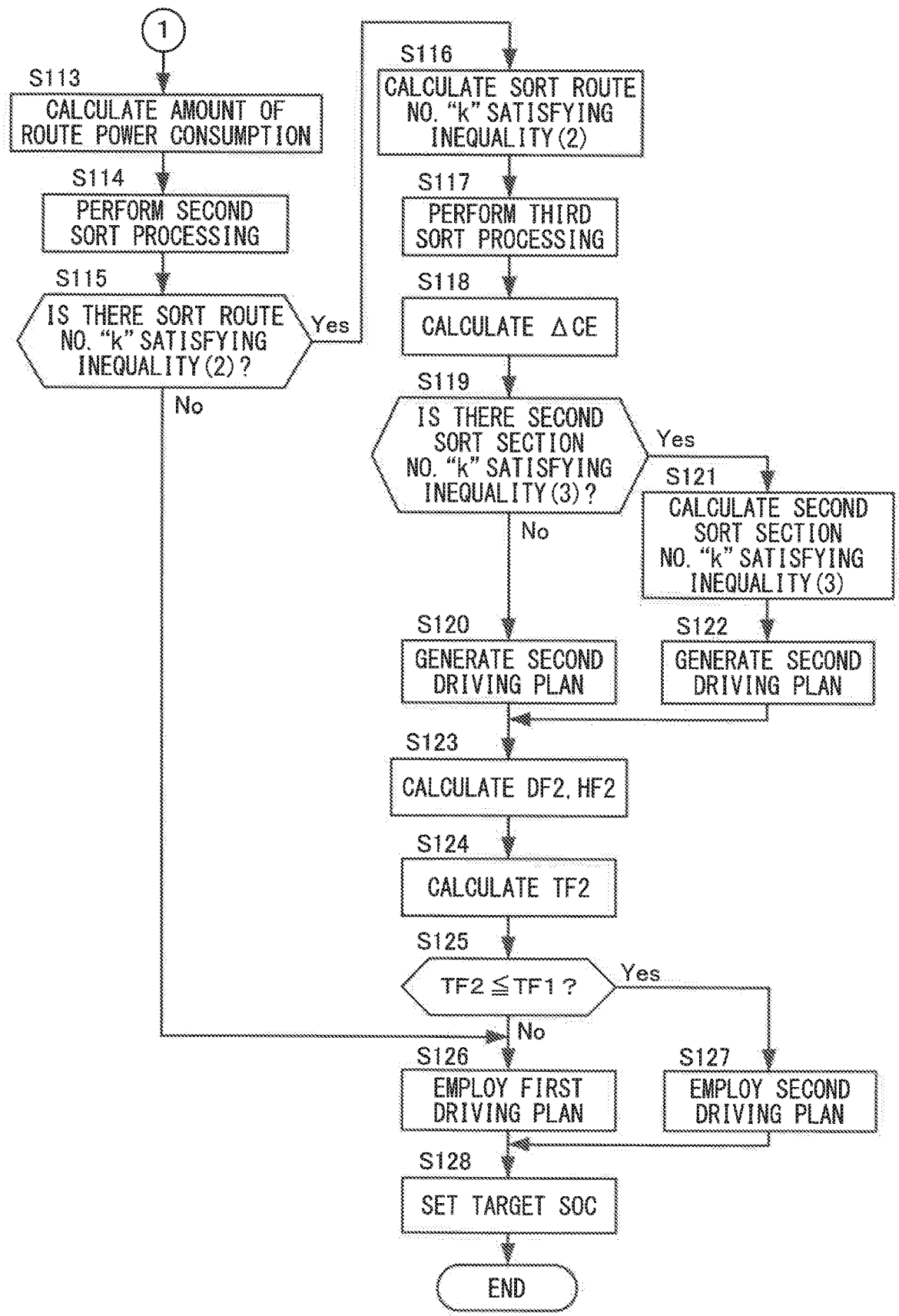
FIG. 3B is a flow chart showing a control routine of processing for generation of a driving plan in the first embodiment of the present invention.
Figure 4A:
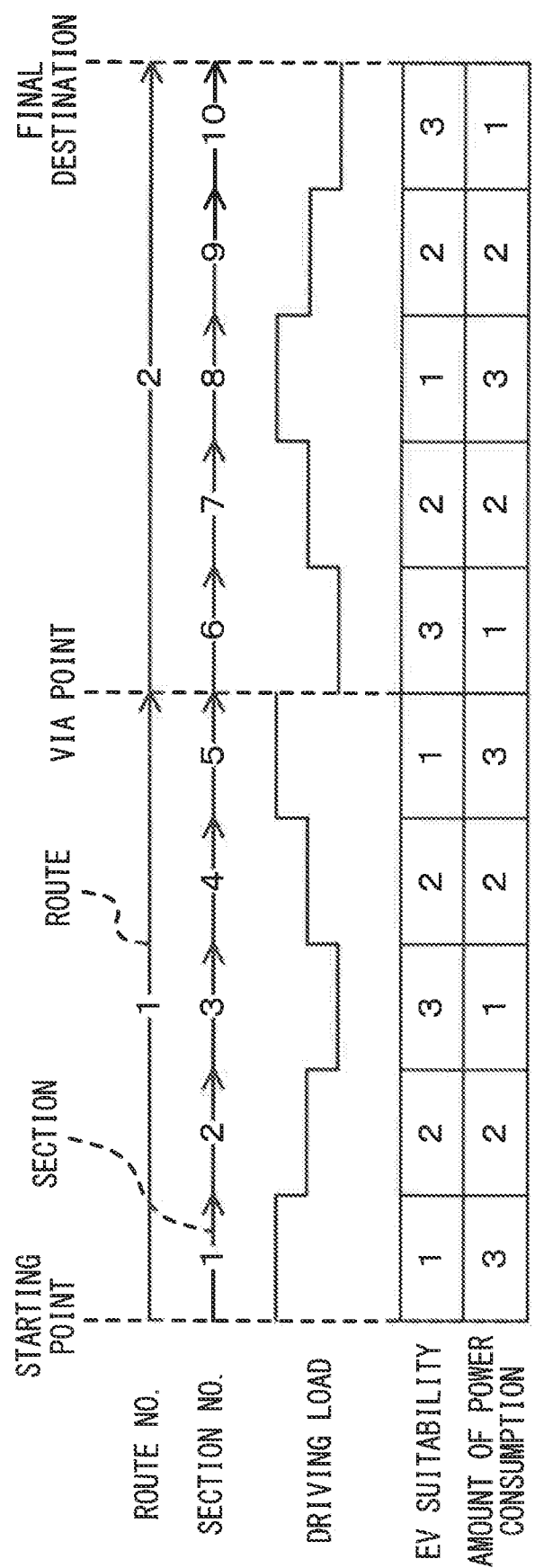
FIG. 4A is a view for explaining generation of a first driving plan.
Figure 4C:
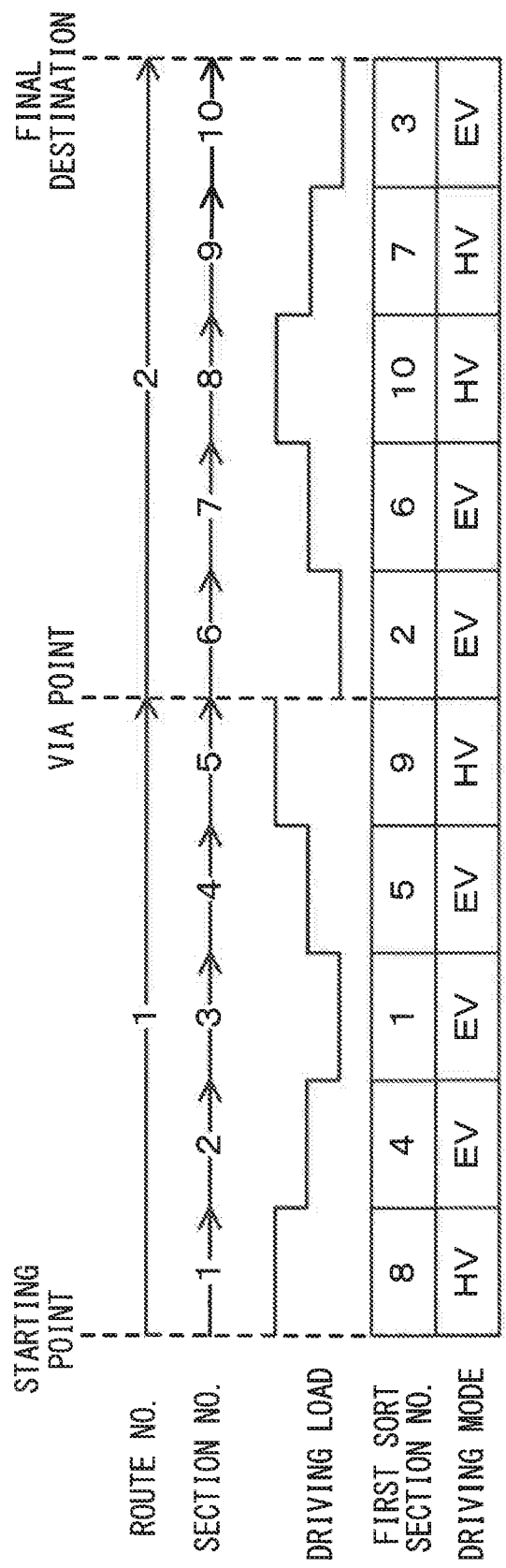
FIG. 4C is a view for explaining generation of the first driving plan.

FIG. 3A and FIG. 3B are flow charts showing a control routine of processing for generating a driving plan in a first embodiment of the present invention. The present control routine is performed by the ECU 60. In the present control routine, a first driving plan not considering the number of times of warm-up of the catalyst 43 and a second driving plan considering the number of times of warm-up of the catalyst 43 are generated and the driving plan with a smaller total of the amounts of fuel consumption is employed. FIG. 4A to FIG. 4C are views for explaining the generation of the first driving plan. FIG. 5A to FIG. 5G are views for explaining the generation of the second driving plan.

At step S101 of FIG. 3A, the driving plan generating part 61, as shown in FIG. 4A, divides a driving route from a departure point to a final destination into a plurality of routes and divides each of the routes into pluralities of sections. A route has a via point as at least one of the starting point and end point. In the example of FIG. 4A, it is comprised of a first route from the departure point to a via point and a second route from the via point to a final destination. Further, the first route and the second route are respectively divided into five sections. The sections are determined based on the distances, positions of any cross points, road IDs contained in map information of the map database 53, etc.

The departure point and the final destination are, for example, set to a main storage location of the vehicle 1 such as the home. Note that, the departure point and the final destination do not necessarily have to be the same. For example, if there is a charging station with a high frequency of utilization, the home and charging station may be set as the departure point and the final destination or the home and charging station may be set as the final destination and departure point.

A via point is an end point of one trip. For example, it is set to a destination input by the driver to the navigation system 54 at the departure point. Further, if the vehicle 1 travels around a plurality of destinations set in advance, the destinations are set as via points. Further, if the vehicle 1 is used to commute to work, the workplace is set as a via point or if the vehicle is used to commute to school, the school is set as a via point. Note that, the navigation system 54 may be configured so that the driver can input the departure point, the final destination, and the via points.

Next, at step S102, the driving plan generating part 61 calculates the driving load of each of the sections based on the road information of the sections (for example, road gradients, speed limits, types of roads, etc.). The road information of the sections is acquired from the map database 53. Note that, the driving plan generating part 61 may calculate the driving load of each of the sections based on the driving logs of the sections.

The driving plan generating part 61 calculates the EV suitabilities of the sections based on the driving loads of the sections. The EV suitability is a parameter indicating the suitability to the EV mode and is made higher the lower the driving load. In the present description, the EV suitability is expressed by a simplified numerical value. The EV suitability becomes higher the larger the numerical value.

Further, the driving plan generating part 61 calculates the amount of power consumption of the section based on the driving load and distance of the section. In the present description, the amount of power consumption is expressed by a simplified numerical value. The amount of power consumption becomes larger the larger the numerical value.

Next, at step S103, the driving plan generating part 61 calculates the amount of total power consumption TE when the vehicle 1 is being driven over an entire driving route by the EV mode based on the amounts of power consumption of the sections. The amount of total power consumption TE is the total of the amounts of power consumption of the sections.

Next, at step S104, the driving plan generating part 61 calculates the amount of electric power CE of the battery 20 able to be used in the EV mode and judges whether the amount of electric power CE is equal to or more than the amount of total power consumption TE. The driving plan generating part 61 calculates the amount of electric power CE based on the SOC of the battery 20. The higher the SOC of the battery 20, the larger the amount of electric power CE.

If at step S104 it is judged that the amount of electric power CE is equal to or more than the amount of total power consumption TE, the control routine proceeds to step S105. At step S105, the driving plan generating part 61 sets the driving modes of all of the sections to the EV mode. That is, the entire route is set to an EV route. After step S105, the present control routine ends.

On the other hand, if at step S104 it is judged that the amount of electric power CE is less than the amount of total power consumption TE, the control routine proceeds to step S106. At step S106, the driving plan generating part 61, as shown in FIG. 4B, performs the first sort processing to rearrange the order of the sections.

In the first sort processing, the order of the sections is rearranged based on the EV suitability, the amount of power consumption, and the section no. Specifically, the sections are rearranged in the order of the highest EV suitability down. Further, if the EV suitability is equal, the sections are rearranged in the order of the smallest amount of power consumption up. Further, if the EV suitability and the amount of power consumption are equal, the sections are rearranged in the order of the smallest section no. up. Furthermore, the driving plan generating part 61 assigns a first sort section no. to each section in the rearranged order (i=1, . . . , n; in the example shown in FIG. 4B, n=10).

Next, at step S107, the driving plan generating part 61 judges whether there is a first sort section no. "k" satisfying the following inequality (1):

$$DE_k \leq CE < DE_{k+1} \quad (1)$$

Here, $DE_k$ is the total of the amounts of power consumption of the sections from the first sort section no. 1 to the first sort section no. "k". $DE_{k+1}$ is the total of the amounts of power consumption of the sections from the first sort section no. 1 to the first sort section no. k+1.

Specifically, the driving plan generating part 61 judges that there is no sort section no. "k" satisfying the inequality (1) if the amount of power consumption $DE_1$ of the section when the first sort section no. is 1 is larger than the amount of electric power CE calculated at step S104. On the other hand, the driving plan generating part 61 judges that there is a first sort section no. "k" satisfying the inequality (1) if the amount of power consumption $DE_1$ is equal to or less than the amount of electric power CE.

If at step S107 it is judged that there is no first sort section no. "k" satisfying the inequality (1), the control routine proceeds to step S108. At step S108, the driving plan generating part 61 sets the driving modes of all sections to the HV mode. After step S108, the present control routine ends. Note that, at step S108, the driving plan generating part 61 may set the driving mode of the section of the first sort section no. 1 to the EV mode and set the driving modes of the other sections to the HV mode. In this case, when the SOC of the battery 20 becomes less than the lower limit value at the section of the first sort section no. 1, the driving mode is changed from the EV mode to the HV mode.

On the other hand, if at step S107 it is judged that there is a first sort section no. "k" satisfying the inequality (1), the control routine proceeds to step S109. At step S109, the driving plan generating part 61 calculates the first sort section no. "k" satisfying the inequality (1).

Next, at step S110, the driving plan generating part 61, as shown in FIG. 4B, sets the driving modes of the sections from the first sort section no. 1 to the first sort section no. "k" (in the example shown in FIG. 4B, k=6) to the EV mode and sets the driving modes of the sections from the sort section no. k+1 to the first sort section no. "n" to the HV mode. Further, the driving plan generating part 61, as shown in FIG. 4C, generates the first driving plan by rearranging the sections in the order of the section nos.

Next, at step S111, the driving plan generating part 61 calculates the amount of fuel consumed due to driving over the section (below, referred to as the "amount of driving fuel consumption") and calculates an amount of first driving fuel consumption DF1 which is the total of the amounts of driving fuel consumption when the vehicle 1 is driven over an entire driving route based on the first driving plan. Note that, in an EV section where the driving mode is set to the EV mode, the amount of driving fuel consumption becomes zero, while in an HV section where the driving mode is set to the HV mode, the amount of driving fuel consumption becomes larger than zero. The driving plan generating part 61 calculates the amount of driving fuel consumption of the HV section based on the driving load and distance of the HV section.

Further, at step S111, the driving plan generating part 61 calculates the amount of fuel consumed for warming up the catalyst 43 at the section (below, "amount of warm-up fuel consumption") and calculates the amount of first warm-up fuel consumption HF1 which is the total of the amounts of warm-up fuel consumption when the vehicle 1 is driven over an entire driving route based on the first driving plan. Note that in an EV section, the amount of warm-up fuel consumption becomes zero, while in an HV section, the amount of warm-up fuel consumption becomes greater than zero. The amount of first warm-up fuel consumption HF1 is calculated assuming the catalyst 43 is warmed up at only the initial HV section of the route.

Next, at step S112, the driving plan generating part 61 calculates the amount of first total fuel consumption TF1 which is the total of the amounts of fuel consumption when the vehicle 1 is driven over an entire driving route based on the first driving plan. The driving plan generating part 61 calculates the amount of first total fuel consumption TF1 as the total of the amount of first driving fuel consumption DF1 and the amount of first warm-up fuel consumption HF1 (TF1=DF1+HF1).

Next, at step S113, the driving plan generating part 61, as shown in FIG. 5A, calculates the amount of power consumption when the vehicle 1 is driven over the route by the EV mode (below, referred to as "the amount of route power consumption") based on the amounts of power consumption of the sections. The driving plan generating part 61 calculates the amount of route power consumption as the total of the amounts of power consumption of the sections of the route.

Next, at step S114, the driving plan generating part 61, as shown in FIG. 5B, performs second sort processing to rearrange the order of the routes. In the second sort processing, the order of the routes is rearranged based on the amounts of route power consumption. Specifically, the routes are rearranged in the order of the smallest amount of route power consumption up. Furthermore, the driving plan generating part 61 assigns a sort route no. to each route in the rearranged order (i=1, . . . , n; in the example shown in FIG. 5B, n=2).

Next, at step S115, the driving plan generating part 61 judges whether there is a sort section no. "k" satisfying the following inequality (2):

$$RE_k \leq CE < RE_{k+1} \quad (2)$$

Here, $RE_k$ is the total of the amounts of route power consumption of the routes from the sort route no. 1 to the sort route no. "k". $RE_{k+1}$ is the total of the amounts of route power consumption of the routes from the sort route no. 1 to the sort route no. k+1.

Specifically, the driving plan generating part 61 judges that there is no sort route no. "k" satisfying the inequality (2) if the amount of route power consumption $RE_1$ of the route when the sort route no. "k" is 1 is larger than the amount of electric power CE calculated at step S104. On the other hand, the driving plan generating part 61 judges that there is a sort route no. "k" satisfying the inequality (2) if the amount of route power consumption $RE_1$ is equal to or less than the amount of electric power CE.

If at step S115 it is judged that there is no sort route no. "k" satisfying the inequality (2), the control routine proceeds to step S126. At step S126, the driving plan generating part 61 employs the first driving plan as the driving plan. Next, at step S128, the driving plan generating part 61 calculates the target SOC of each of the sections based on the first driving plan. After step S128, the present control routine ends.

On the other hand, if at step S115 it is judged that there is a sort route no. "k" satisfying the inequality (2), the control routine proceeds to step S116. At step S116, the driving plan generating part 61 calculates the sort route no. "k" satisfying the inequality (2).

Next, at step S117, the driving plan generating part 61, as shown in FIG. 5C, performs third sort processing on the sections of the routes from the sort route no. k+1 to the sort route no. "n" (in the example shown in FIG. 5C, k=1, n=2) to rearrange the order of sections. In the example shown in FIG. 5C, the order of the sections of the first route are rearranged.

In the third sort processing, in the same way as the first sort processing, the order of the sections is rearranged based on the EV suitability, the amount of power consumption, and the section no. Specifically, the sections are rearranged in the order of the highest EV suitability down. Further, if the EV suitability is equal, the sections are rearranged in the order of the smallest amount of power consumption up. Further, if the EV suitability and the amount of power consumption are equal, the sections are rearranged in the order of the smallest section no. up. Furthermore, the driving plan generating part 61 assigns a second sort section no. to each section in the rearranged order (i=1, . . . , n; in the example shown in FIG. 5C, n=5).

Next, at step S118, the driving plan generating part 61 subtracts the total $RE_k$ of the amounts of route power consumption of the routes up to the sort route no. "k" from the amount of electric power CE calculated at step S104 to thereby calculate the amount of excess electric power ΔCE of the battery 20 ($\Delta CE = CE - RE_k$).

Next, at step S119, the driving plan generating part 61 judges whether there is a second sort section no. "k" satisfying the following inequality (3):

$$EE_k \leq \Delta CE < EE_{k+1} \quad (3)$$

Here, $EE_k$ is the total of the amounts of power consumption of the sections from the second sort section no. 1 to the second sort section no. "k". $EE_{k+1}$ is the total of the amounts of power consumption of the sections from the second sort section no. 1 to the second sort section no. k+1.

Specifically, the driving plan generating part 61 judges that there is no second sort section no. "k" satisfying the inequality (3) if the amount of power consumption $EE_1$ when the second sort section no. "k" is 1 is larger than the amount of electric power CE. On the other hand, the driving plan generating part 61 judges that there is a second sort section no. "k" satisfying the inequality (3) if the amount of power consumption $EE_1$ is equal to or less than the amount of electric power CE.

Figure 5D:
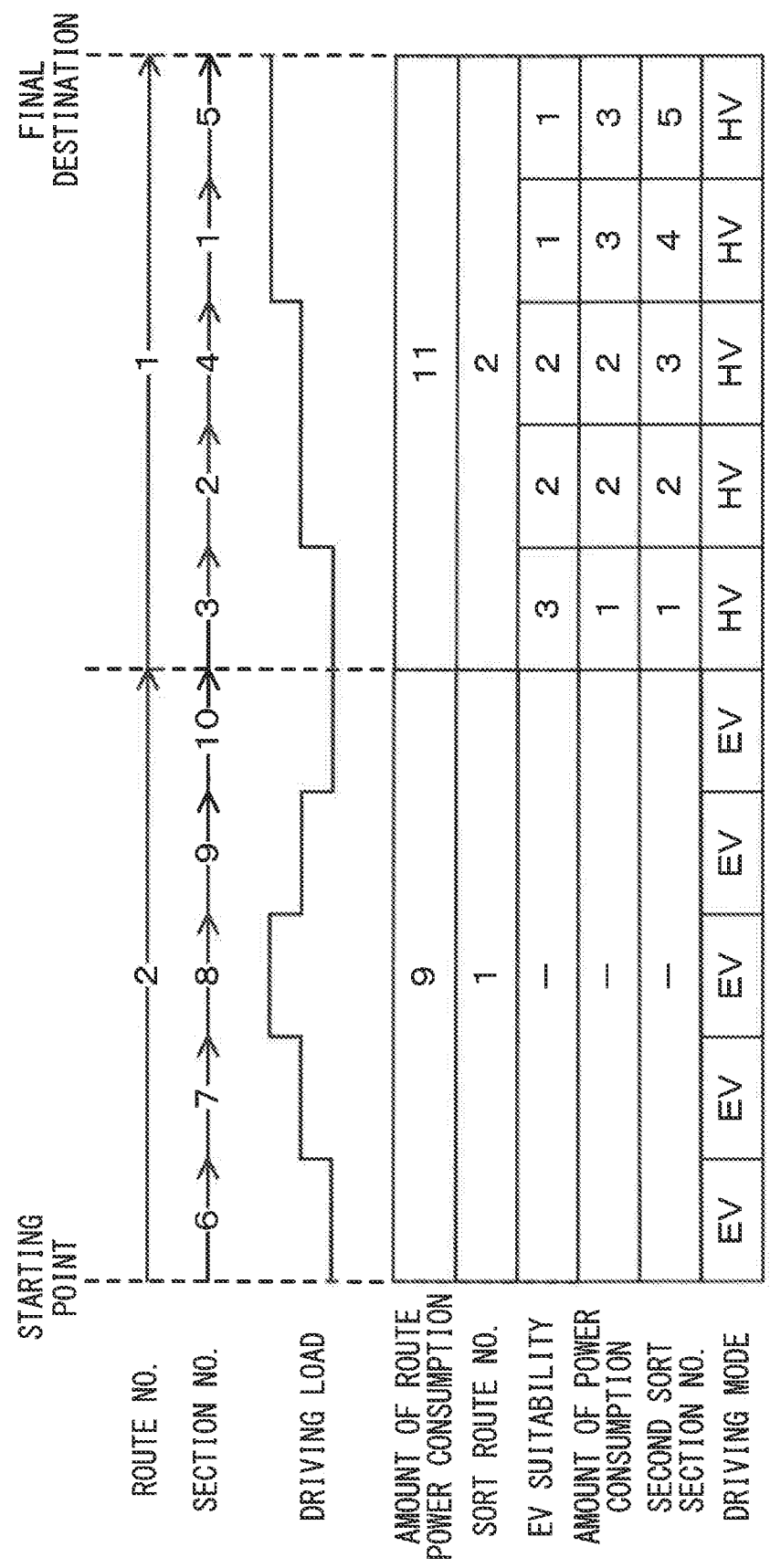
FIG. 5D is a view for explaining generation of the second driving plan.

If at step S119 it is judged that there is no second sort section no. "k" satisfying the inequality (3), the control routine proceeds to step S120. At step S120, the driving plan generating part 61 sets the driving modes of all of the sections of the routes up to the sort route no. "k" (in the example of FIG. 5D, k=1) to the EV mode and sets the driving modes of all of the sections of the routes from the sort route no. k+1 to the sort route no. "n" to the HV mode. Next, the driving plan generating part 61, as shown in FIG. 5E, rearranges the sections in the order of the section nos. to thereby generate a second driving plan.

On the other hand, if at step S119 it is judged that there is a second sort section no. "k" satisfying the inequality (3), the control routine proceeds to step S121. At step S121, the driving plan generating part 61 calculates the second sort section no. "k" satisfying the inequality (3).

Figure 5G:
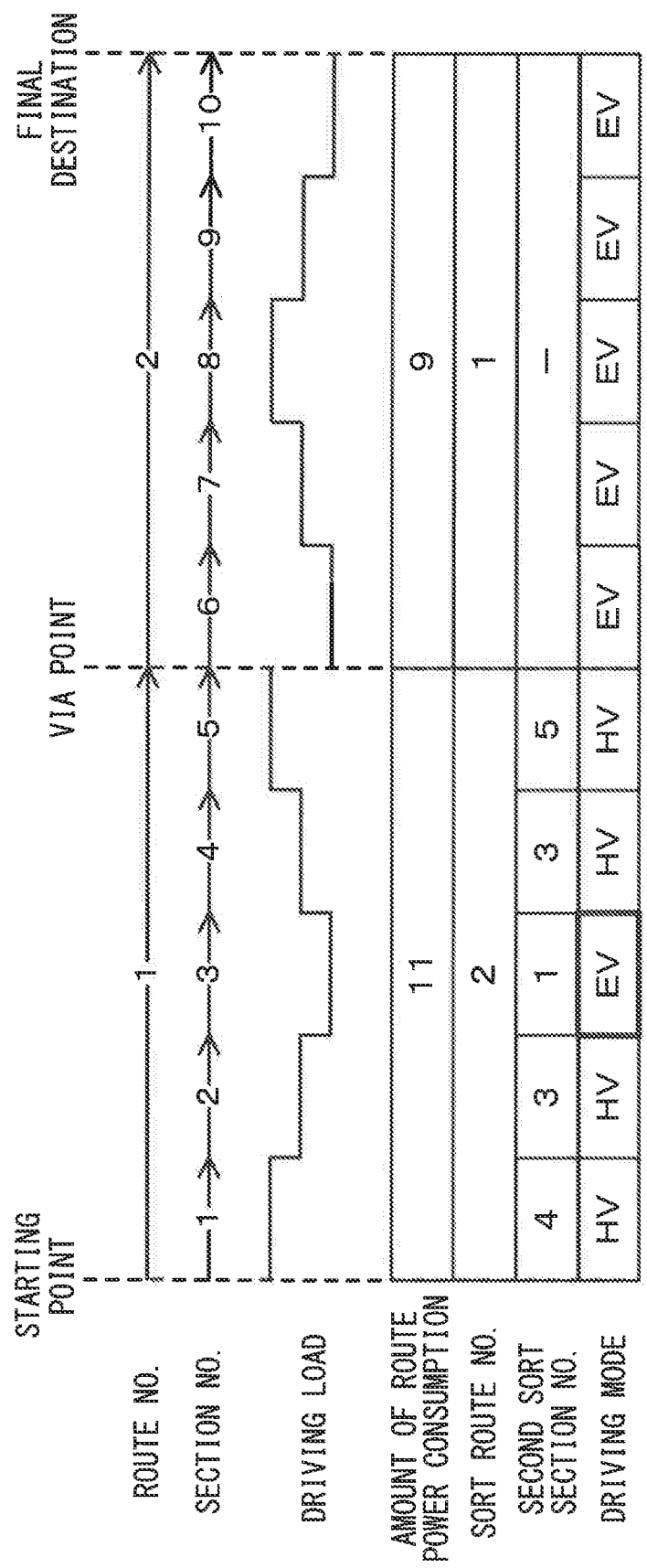
FIG. 5G is a view for explaining generation of the second driving plan.

Next, at step S122, the driving plan generating part 61, as shown in FIG. 5F, sets the driving modes of all of the sections of the routes up to the sort route no. "k" (in the example of FIG. 5F, k=1) to the EV mode. Further, for the routes from the sort route no. k+1 to the sort route no. "n", the driving plan generating part 61 sets the driving modes of the sections from the second sort section no. 1 to the second sort section no. "k" (in the example shown in FIG. 5F, k=1) to the EV mode and sets the driving modes of the sections from the second sort section no. k+1 to the second sort section no. "n" to the HV mode. Next, the driving plan generating part 61, as shown in FIG. 5G, rearranges the sections in the order of the section nos. to generate a second driving plan.

After step S120 or step S122, at step S123, the driving plan generating part 61 calculates the amount of driving fuel consumption of each of the sections and calculates the amount of second driving fuel consumption DF2 which is the total of the amounts of driving fuel consumption when the vehicle 1 is driven over an entire driving route based on the second driving plan. The driving plan generating part 61 calculates the amounts of driving fuel consumption of the HV section based on the driving load and distance of the HV section.

Further, at step S123, the driving plan generating part 61 calculates the amount of warm-up fuel consumption of each of the sections and calculates the amount of second warm-up fuel consumption HF2 which is the total of the amounts of warm-up fuel consumption when the vehicle 1 is driven over an entire driving route based on the second driving plan. The amount of second warm-up fuel consumption HF2 is calculated assuming that the catalyst 43 is warmed up only in the initial HV section of the route.

Next, at step S124, the driving plan generating part 61 calculates the amount of second total fuel consumption TF2 which is the total of the amounts of fuel consumption when the vehicle 1 is driven along the entire driving route based on the second driving plan. The driving plan generating part 61 calculates the amount of second total fuel consumption TF2 as the total of the amount of second driving fuel consumption DF2 and the amount of second warm-up fuel consumption HF2 (TF2=DF2+HF2).

Next, at step S125, the driving plan generating part 61 judges whether the amount of second total fuel consumption TF2 is equal to or less than the amount of first total fuel consumption TF1. If it is judged that the amount of second total fuel consumption TF2 is equal to or less than the amount of first total fuel consumption TF1, the control routine proceeds to step S127.

At step S127, the driving plan generating part 61 employs the second driving plan as the driving plan. Next, at step S128, the driving plan generating part 61 calculates the target SOC of each of the sections based on the second driving plan. After step S128, the present control routine ends.

On the other hand, if at step S125 it is judged that the amount of second total fuel consumption TF2 is larger than the amount of first total fuel consumption TF1, the control routine proceeds to step S126. At step S126, the driving plan generating part 61 employs the first driving plan as the driving plan. Next, at step S128, the driving plan generating part 61 calculates the target SOC of each of the sections based on the first driving plan. After step S128, the present control routine ends.

Note that, in the present control routine, it is also possible that only the second driving plan be generated and the second driving plan be employed as the driving plan.

<Deviation from Target SOC>

By driving the vehicle 1 based on a driving plan generated as explained above, it is possible to improve the fuel efficiency of the vehicle 1. However, sometimes the actual SOC of the battery 20 will deviate from the target SOC due to the driving conditions of the vehicle 1, the traffic conditions of the driving route, etc. For example, if the amount of electric power consumed in an air-conditioner provided in the vehicle 1 is large, if congestion occurs on the driving route etc., the amount of power consumption will become greater than anticipated and the actual SOC will become lower than the target SOC.

If the actual SOC falls and reaches the lower limit value, the battery 20 deteriorates. Therefore, the output control part 62 changes the driving mode set by the driving plan generating part 61 so that the actual SOC is maintained or becomes higher if the actual SOC of the battery 20 reaches the lower limit value.

For example, the output control part 62 changes the driving mode set by the driving plan generating part 61 from the EV mode to the HV mode so that the actual SOC is maintained if the actual SOC of the battery 20 reaches the lower limit value. Further, the output control part 62 may change the driving mode set by the driving plan generating part 61 from the EV mode or the HV mode to the RE (Range Extender) mode so that the actual SOC becomes higher if the actual SOC of the battery 20 reaches the lower limit value.

In the RE mode, the internal combustion engine 40 is operated and the engine load is fixed to a predetermined value regardless of the driving load. The predetermined value is predetermined and is set so that the heat efficiency of the internal combustion engine 40 becomes higher. In the RE mode, the output of the internal combustion engine 40 is used as drive use power and the supply of electric power from the battery 20 is stopped. Further, in the RE mode, the battery 20 is charged by electric power generated by a part of the output of the internal combustion engine 40 in accordance with the driving load. For this reason, in the RE mode, basically, the amount of electric power of the battery 20 increases and the SOC of the battery 20 becomes higher. Note that, the RE mode is also called the "SOC restoration mode".

However, if the driving mode is changed to the HV mode or RE mode in a section on an EV route, the catalyst 43 has to be warmed up at the EV route and the vehicle 1 greatly deteriorates in fuel consumption. Therefore, in the present embodiment, the lower limit value setting part 63 lowers the lower limit value at an EV route compared with a non-EV route other than an EV route. Due to this, the possibility of the driving mode being changed at the EV route becomes lower and the number of times the catalyst 43 is warmed up can be kept from increasing.

FIG. 6 is a view showing a specific example of the control in the first embodiment of the present invention together with a comparative example. In the example of FIG. 6, there are three via points between the departure point and the final destination. For this reason, the route of the driving route is comprised of a first route from the departure point to a first via point, a second route from the first via point to a second via point, a third route from the second via point to a third via point, and a fourth route from the third via point to the final destination. The first route is divided into the two sections of a first section and a second section. The second route is divided into the two sections of a third section and a fourth section. The third route is divided into the four sections of a fifth section to an eighth section. The fourth route is divided into the two sections of a ninth section and a 10th section.

In the example of FIG. 6, the second driving plan is employed as the driving plan, the first route and the fourth route are EV routes, and the second route and the third route are non-EV routes. Further, the first section, second section, sixth section, ninth section, and 10 section are EV sections, while the third section to the fifth section, the seventh section, and the eighth section are HV sections.

FIG. 6 shows a driving mode, target SOC, amount of driving fuel consumption, amount of warm-up fuel consumption, and amount of cumulative fuel consumption of each of the sections in the case where the vehicle 1 is being driven based on a driving plan. The amount of cumulative fuel consumption is the total amount of the fuel consumed up to that section. Therefore, the amount of cumulative fuel consumption is calculated by cumulatively adding the amount of driving fuel consumption and amount of warm-up fuel consumption.

Further, FIG. 6 shows the driving mode, actual SOC, amount of driving fuel consumption, amount of warm-up fuel consumption, amount of cumulative fuel consumption, and cumulative battery deterioration index when the controls of Comparative Example 1, Comparative Example 2, and the first embodiment are performed. The actual SOC is calculated based on the output of the voltage sensor 51 etc. In FIG. 6, the target SOC, actual SOC, amount of driving fuel consumption, amount of warm-up fuel consumption, amount of cumulative fuel consumption, and cumulative battery deterioration index are expressed by simplified numerical values. The parameters become larger the larger the numerical values. Further, in FIG. 6, the target SOC and the actual SOC show values at the end points of the sections. In an EV section, the target SOC and the actual SOC gradually become lower in that section.

The cumulative battery deterioration index is an indicator showing the degree of deterioration of the battery 20 and is made larger the larger the degree of deterioration of the battery 20. The cumulative battery deterioration index is calculated by cumulatively adding the battery deterioration indexes of the sections. In the example of FIG. 6, the battery deterioration index is made larger than zero when the actual SOC is lower than 2 while is made larger the lower the actual SOC. The driving plan is generated so that the cumulative battery deterioration index becomes zero. For this reason, in the driving plan, the lower limit value of the SOC of the battery 20 is set to 2, and the target SOCV when the vehicle 1 reaches the final destination is set to the lower limit value.

Figure 7:
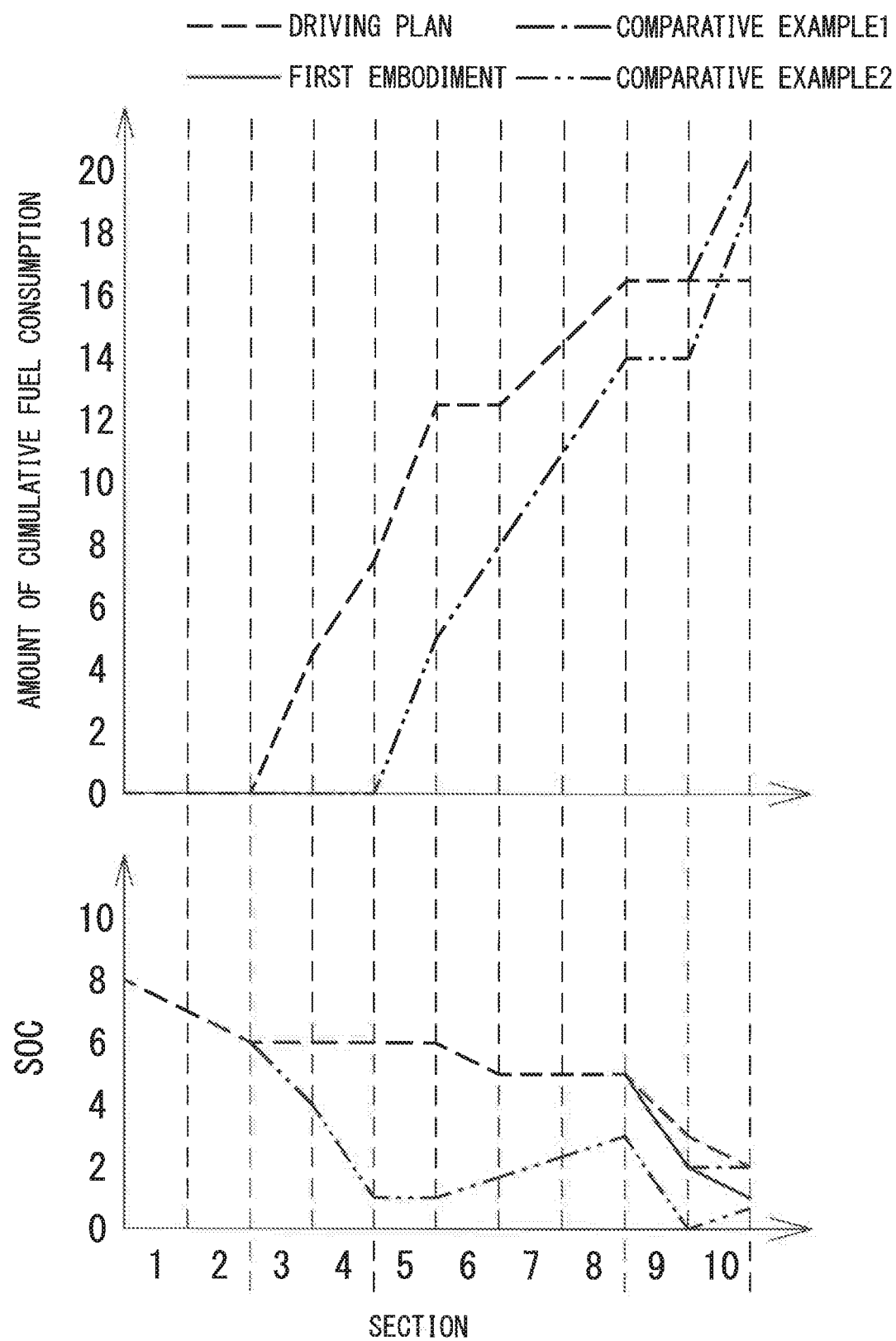
FIG. 7 is a view showing changes of the amount of cumulative fuel consumption and SOC in a driving plan, Comparative Example 1, Comparative Example 2, and first embodiment.

FIG. 7 is a view showing the changes in the amount of cumulative fuel consumption and SOC in the driving plan, Comparative Example 1, Comparative Example 2, and first embodiment. In FIG. 7, the target SOC and amount of cumulative fuel consumption in the driving plan are shown by the broken lines, the actual SOC and amount of cumulative fuel consumption in Comparative Example 1 are shown by the one-dot chain lines, the actual SOC and amount of cumulative fuel consumption in Comparative Example 2 are shown by the two-dot chain lines, and the actual SOC in the first embodiment is shown by the solid line. Note that, the amount of cumulative fuel consumption in the first embodiment matches the amount of cumulative fuel consumption in the driving plan.

As shown in FIG. 6 and FIG. 7, in Comparative Example 1, at the ninth section, the amount of power consumption becomes larger than anticipated. At the end point of the ninth section, the actual SOC reaches the lower limit value (2). For this reason, at the 10th section, the driving mode is changed from the EV mode to the HV mode. As a result, at the 10th section, the actual SOC is maintained.

In Comparative Example 1, the driving mode on the tenth route of the EV route is changed from the EV mode to the HV mode. For this reason, on the EV route, the catalyst 43 is warmed up. The number of times the catalyst 43 is warmed up increases compared with the driving plan. As a result, in Comparative Example 1, the amount of cumulative fuel consumption when the vehicle 1 reaches the final destination becomes much larger than the driving plan.

In Comparative Example 2, in all sections, the lower limit value is made lower than the driving plan and is set to zero so that the sections where the driving mode is set to the EV mode become greater. In Comparative Example 2, unlike the driving plan, the driving mode is set to the EV mode in the third section and the fourth section while the driving mode is set to the RE mode in the fifth section to the eighth section and the 10th section.

In Comparative Example 2, the number of times the catalyst 43 is warmed up becomes 2 and the amount of driving fuel consumption when the driving mode is set to the RE mode becomes greater. As a result, in Comparative Example 2, the amount of cumulative fuel consumption when the vehicle 1 reaches the final destination becomes much greater compared with the driving plan. Further, the time period when the actual SOC is lower than 2 becomes longer and the cumulative battery deterioration index becomes larger.

On the other hand, in the first embodiment, on only the EV route, the lower limit value is made lower than the driving plan. For this reason, even if the actual SOC reaches 2 at the end point of the ninth section of the EV route, the driving mode is maintained at the EV mode at the 10th section. As a result, in the first embodiment, the number of times the catalyst 43 is warmed up and the amount of cumulative fuel consumption become the same as the driving plan. Further, at only the 10th section, the actual SOC becomes lower than 2, so the cumulative battery deterioration index becomes smaller than Comparative Example 2. Therefore, in the first embodiment, it is possible to keep the battery 20 from deteriorating while it is possible to keep the number of times the catalyst 43 is warmed up from increasing.

<Processing for Changing Driving Mode>

Figure 8:
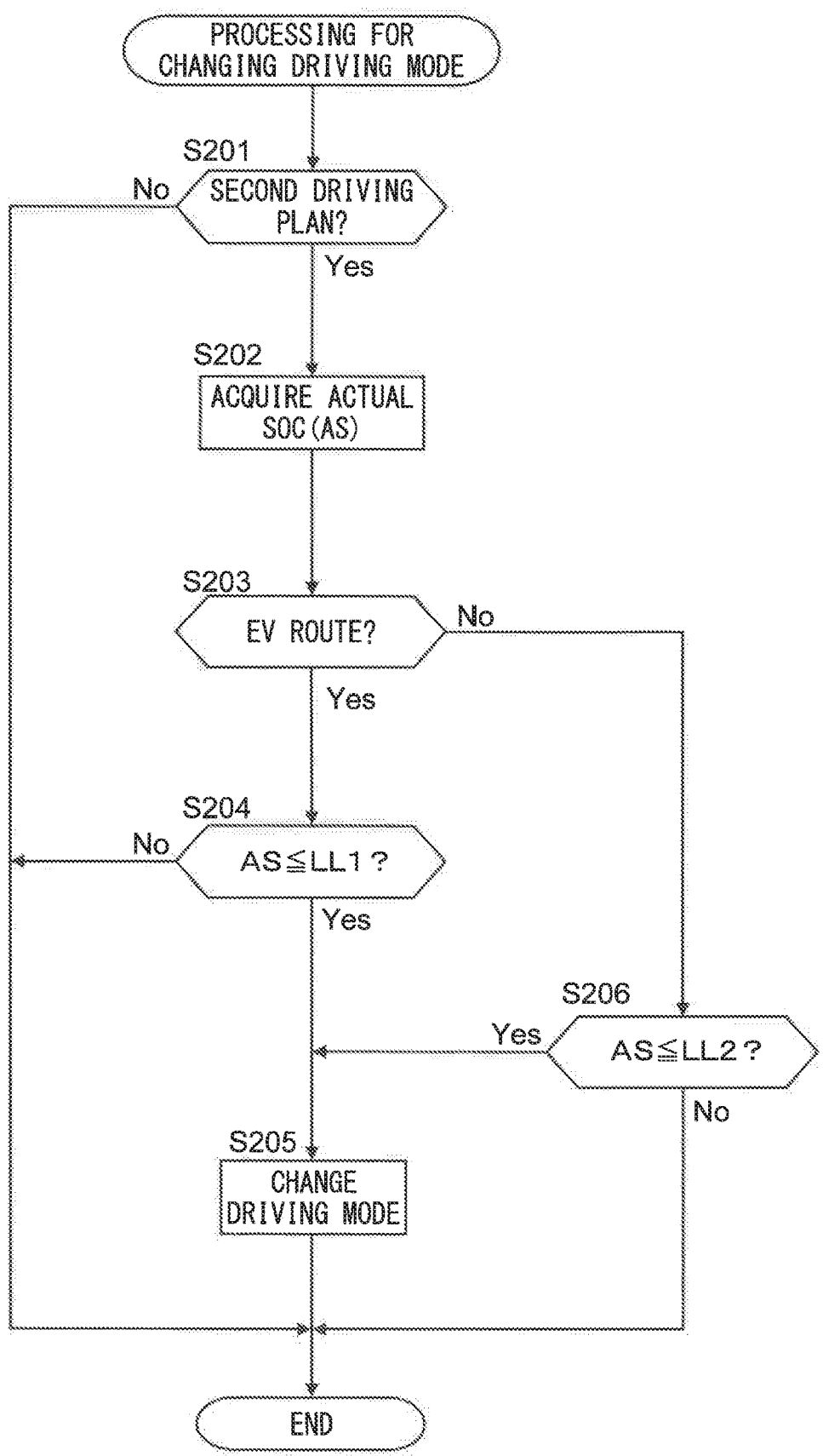
FIG. 8 is a flow chart showing a control routine of processing for changing a driving mode in the first embodiment of the present invention.

FIG. 8 is a flow chart showing a control routine of processing for changing a driving mode in the first embodiment of the present invention. The present control routine is repeatedly executed by the ECU 60 at predetermined intervals.

First, at step S201, the output control part 62 judges whether the second driving plan has been employed as the driving plan. If it is judged that the first driving plan has been employed, the present control routine is ended. On the other hand, if it is judged that the second driving plan has been employed, the present control routine proceeds to step S202.

At step S202, the output control part 62 acquires the actual SOC (AS) of the battery 20. The actual SOC (AS) is calculated based on the output of the voltage sensor 51 etc. Next, at step S203, the output control part 62 judges whether the route being driven on is an EV route. If it is judged that the route being driven on is a non-EV route, the present control routine proceeds to step S206.

At step S206, the lower limit value setting part 63 sets the lower limit value to the second lower limit value LL2, and the output control part 62 judges whether the actual SOC (AS) is equal to or less than the second lower limit value LL2 The second lower limit value LL2 is predetermined. If at step S206 it is judged that the actual SOC (AS) is higher than the second lower limit value LL2, the present control routine is ended.

On the other hand, if at step S203 it is judged that the route being driven on is an EV route, the present control routine proceeds to step S204. At step S204, the lower limit value setting part 63 sets the lower limit value to the first lower limit value LL1, and the output control part 62 judges whether the actual SOC (AS) is equal to or less than the first lower limit value LL1. The first lower limit value LL1 is predetermined and is set to a value lower than the second lower limit value LL2. If at step S204 it is judged that the actual SOC (AS) is higher than the first lower limit value LL1, the present control routine is ended.

If at step S206 it is judged that the actual SOC (AS) is equal to or less than the second lower limit value LL2 or if at step S204 it is judged that the actual SOC (AS) is equal to or less than the first lower limit value LL1, the present control routine proceeds to step S205. At step S205, the output control part 62 changes a driving mode set by the driving plan generating part 61. Specifically, the output control part 62 changes a driving mode from an EV mode or HV mode to an RE mode so that the actual SOC becomes higher. After step S205, the present control routine is ended.

Note that, at step S205, the output control part 62 may change a driving mode from the EV mode to the HV mode so that the actual SOC is maintained. Further, if only the second driving plan is generated in the control routine of the processing for generating a driving plan of FIG. 3A and FIG. 3B, step S201 may be omitted.

Second Embodiment

The control device of a hybrid vehicle according to a second embodiment is basically similar in configuration and control to the control device of a hybrid vehicle according to the first embodiment except for the points explained below. For this reason, below, the second embodiment of the present invention will be explained focusing on the parts different from the first embodiment.

If the battery 20 becomes excessively lower in SOC, the battery 20 becomes greater in degree of deterioration. For this reason, in the second embodiment, the lower limit value setting part 63 lowers the lower limit value at the EV route only if the actual SOC does not reach the reference value when a driving mode is maintained at the EV mode on an EV route. The reference value is predetermined so that the battery 20 does not become greater in degree of deterioration and is set to a value lower than the lower limit value on a non-EV route. By doing this, it is possible to more effectively keep the battery 20 from deteriorating while keeping the number of times the catalyst 43 is warmed up from increasing.

<Processing for Changing Driving Mode>

Figure 9:
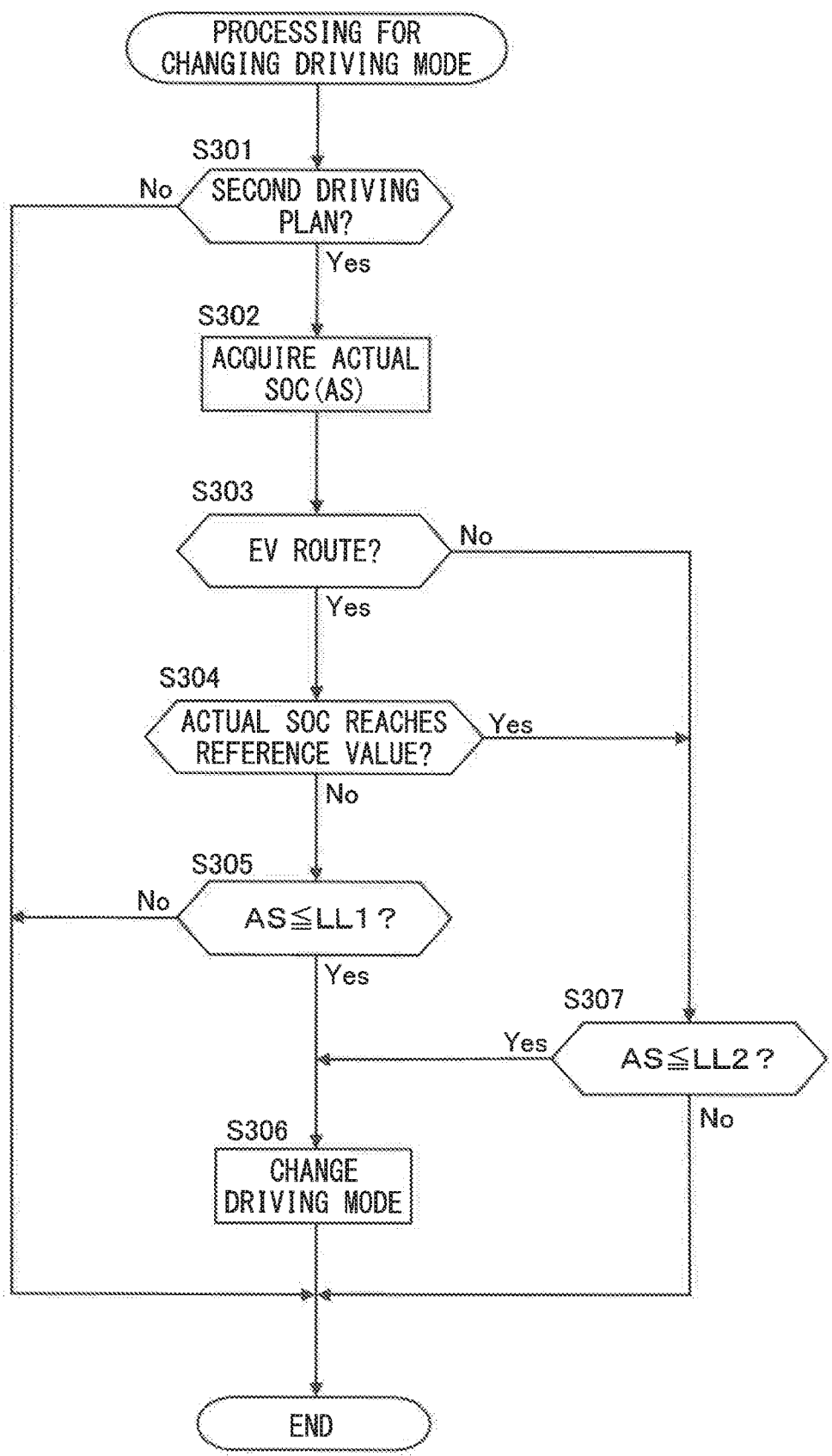
FIG. 9 is a flow chart showing a control routine of processing for changing a driving mode in the second embodiment of the present invention.

FIG. 9 is a flow chart showing a control routine of processing for changing a driving mode in the second embodiment of the present invention. The present control routine is repeatedly executed by the ECU 60 at predetermined intervals.

In the same way as step S201 to step S203 of FIG. 8, step S301 to step S303 are performed. If at step S303 it is judged that the route being driven on is an EV route, the present control routine proceeds to step S304. At step S304, the lower limit value setting part 63 judges whether the actual SOC will reach the reference value when a driving mode is maintained at the EV mode on an EV route. The reference value is predetermined and is set to a value lower than the lower limit value (second lower limit value LL2) on the HV route.

If at step S303 it is judged that the route being driven on is a non-EV route or if at step S304 it is judged that the actual SOC will reach the reference value, the present control routine proceeds to step S307. At step S307, the lower limit value setting part 63 sets the lower limit value to the second lower limit value LL2 and the output control part 62 judges whether the actual SOC (AS) is equal to or less than the second lower limit value LL2. The second lower limit value LL2 is predetermined. If at step S307 it is judged that the actual SOC (AS) is higher than the second lower limit value LL2, the present control routine is ended.

Further, if at step S304 it is judged that the actual SOC will not reach the reference value, the present control routine proceeds to step S305. At step S305, the lower limit value setting part 63 sets the lower limit value to the first lower limit value LL1 and the output control part 62 judges whether the actual SOC (AS) is equal to or less than the first lower limit value LL1. The first lower limit value LL1 is predetermined and is set to a value lower than the second lower limit value LL2. Note that, the first lower limit value LL1 may be the same as the reference value. If at step S305 it is judged that the actual SOC (AS) is higher than the first lower limit value LL1, the present control routine is ended.

If at step S307 it is judged that the actual SOC (AS) is equal to or less than the second lower limit value LL2 or if at step S305 it is judged that the actual SOC (AS) is equal to or less than the first lower limit value LL1, the present control routine proceeds to step S306. At step S306, the output control part 62 changes a driving mode set at the driving plan generating part 61. Specifically, the output control part 62 changes a driving mode from the EV mode or HV mode to the RE mode so that the actual SOC becomes higher. After step S306, the present control routine is ended.

Note that, at step S306, the output control part 62 may change a driving mode from the EV mode to the HV mode so that the actual SOC is maintained. Further, if only the second driving plan is generated in the control routine of the processing for generating a driving plan of FIG. 3A and FIG. 3B, step S301 may be omitted.

Third Embodiment

The control device of a hybrid vehicle according to a third embodiment is basically similar in configuration and control to the control device of a hybrid vehicle according to the first embodiment except for the points explained below. For this reason, below, the third embodiment of the present invention will be explained focusing on the parts different from the first embodiment.

If the lower limit value of the SOC of the battery 20 is made lower in all of the EV routes, the state of a low SOC of the battery 20 is liable to be maintained for a long time. For example, if a consecutive plurality of EV routes are set, if in an EV route away from the final destination, the SOC of the battery 20 becomes lower than the lower limit value at the non-EV route, the state where the SOC of the battery 20 is lower than the lower limit value at the non-EV route may be maintained. In this case, the battery 20 increasingly deteriorates and the battery 20 becomes greater in degree of deterioration.

Therefore, in the third embodiment, the lower limit value of the SOC of the battery 20 is lowered only at the EV route closest to the final destination (in the example of FIG. 6, the fourth route). By doing this, it is possible to keep the battery 20 from deteriorating more effectively.

<Processing for Changing Driving Mode>

Figure 10:
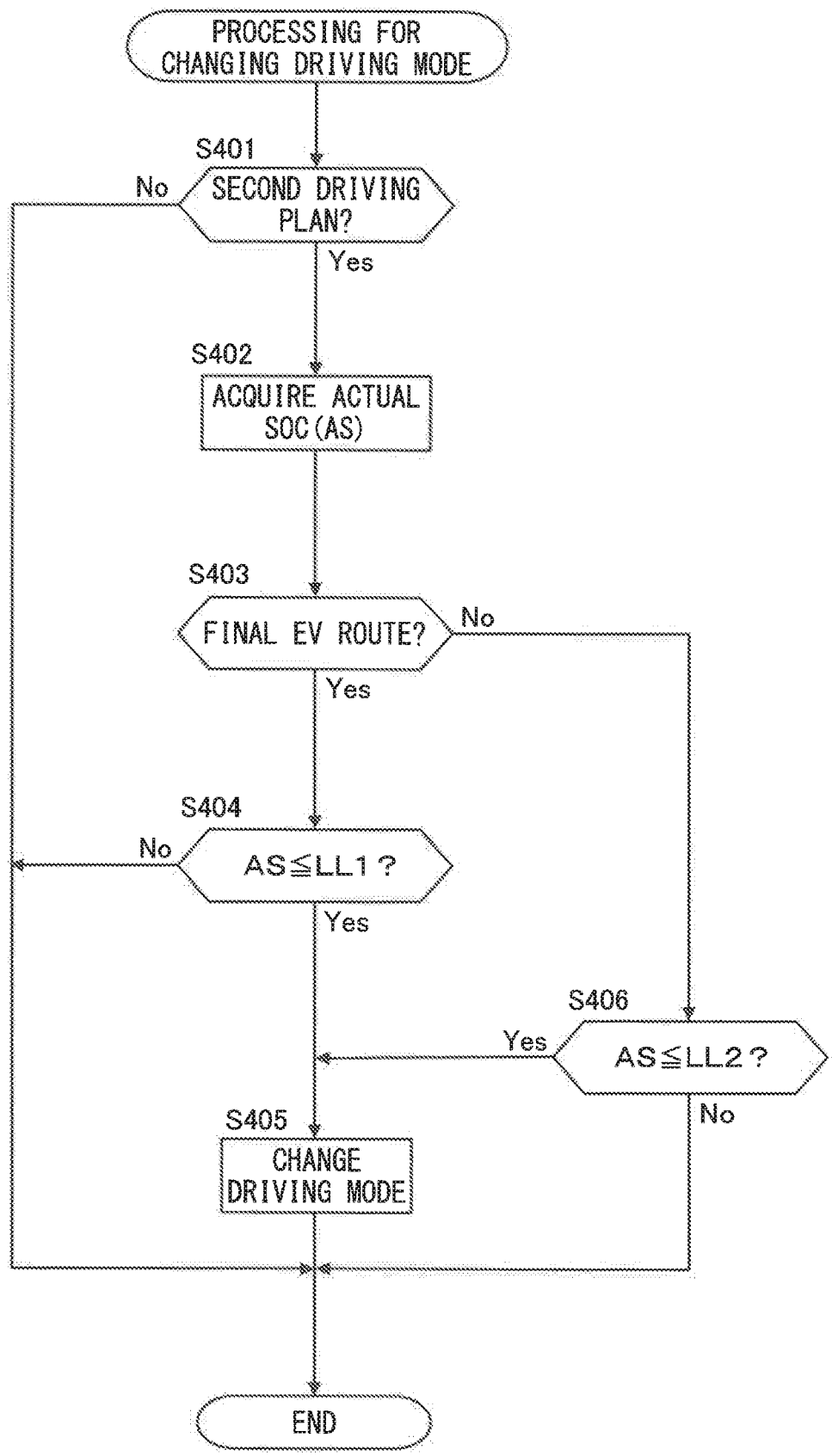
FIG. 10 is a flow chart showing a control routine of processing for changing a driving mode in a third embodiment of the present invention.

FIG. 10 is a flow chart showing a control routine of processing for changing a driving mode in the third embodiment of the present invention. The present control routine is repeatedly executed by the ECU 60 at predetermined intervals.

In the same way as step S201 and step S202 of FIG. 8, step S401 and step S402 are performed. After step S402, at step S403, the lower limit value setting part 63 judges whether the route being driven on is the final EV route, that is, the EV route closest to the final destination. If it is judged that the route being driven on is not the final EV route, the present control routine proceeds to step S406.

At step S406, the lower limit value setting part 63 sets the lower limit value to the second lower limit value LL2, and the output control part 62 judges whether the actual SOC (AS) is equal to or less than the second lower limit value LL2. The second lower limit value LL2 is predetermined. If at step S406 it is judged that the actual SOC (AS) is higher than the second lower limit value LL2, the present control routine is ended.

On the other hand, if at step S403 it is judged that the route being driven on is the final EV route, the present control routine proceeds to step S404. At step S404, the lower limit value setting part 63 sets the lower limit value to the first lower limit value LL1, and the output control part 62 judges whether the actual SOC (AS) is equal to or less than the first lower limit value LL1. The first lower limit value LL1 is predetermined and is set to a value lower than the second lower limit value LL2. If at step S404 it is judged that the actual SOC (AS) is higher than the first lower limit value LL1, the present control routine is ended.

If at step S406 it is judged that the actual SOC (AS) is equal to or less than the second lower limit value LL2 or if at step S404 it is judged that the actual SOC (AS) is equal to or less than the first lower limit value LL1, the present control routine proceeds to step S405. At step S405, the output control part 62 changes a driving mode set by the driving plan generating part 61. Specifically, the output control part 62 changes a driving mode from the EV mode or HV mode to the RE mode so that the actual SOC becomes higher. After step S405, the present control routine is ended.

Note that, step S405, the output control part 62 may change a driving mode from the EV mode to the HV mode so that the actual SOC is maintained. Further, if only the second driving plan is generated in the control routine of the processing for generating a driving plan of FIG. 3A and FIG. 3B, step S401 may be omitted.

Fourth Embodiment

The control device of a hybrid vehicle according to a fourth embodiment is basically similar in configuration and control to the control device of a hybrid vehicle according to the first embodiment except for the points explained below. For this reason, below, the fourth embodiment of the present invention will be explained focusing on the parts different from the first embodiment.

Figure 11:
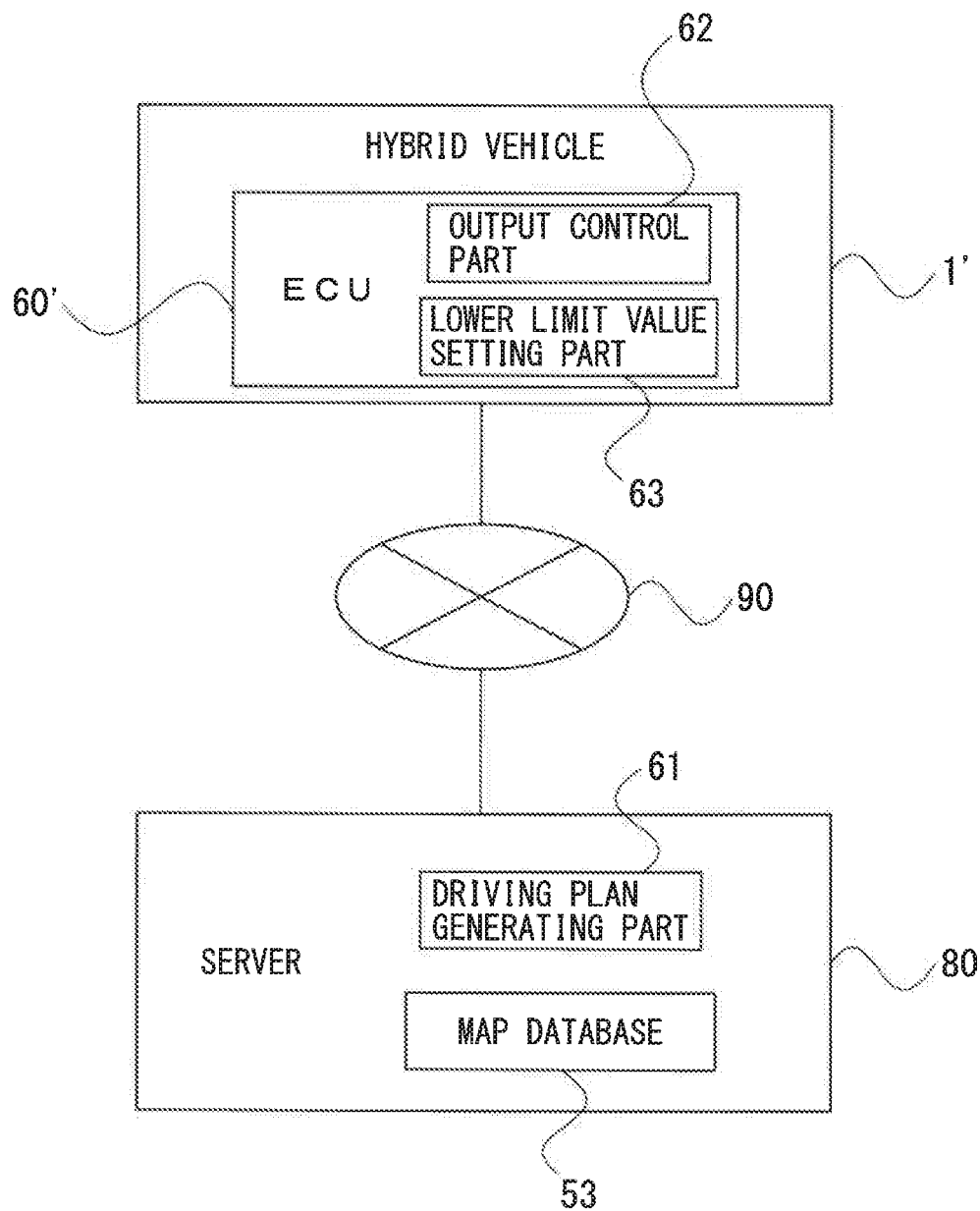
FIG. 11 is a block diagram schematically showing the configuration of a control device of a hybrid vehicle etc. according to a fourth embodiment of the present invention.

FIG. 11 is a block diagram schematically showing the configuration of the control device of a hybrid vehicle according to the fourth embodiment of the present invention. In the fourth embodiment, the control device of a hybrid vehicle is comprised of the ECU 60' and server 80. The ECU 60' and server 80 are respectively provided with communication interfaces and can communicate with each other through a network 90. Note that, the server 80 can communicate with not only the vehicle 1', but also a plurality of other vehicles.

The server 80 is provided with, in addition to a communication interface, a central processing unit (CPU), a memory like a random access memory (RAM), a hard disk drive, etc. The server 80 runs a program stored in the hard disk drive etc., to function as the driving plan generating part 61. Further, the server 80 is provided with a map database 53, and the driving plan generating part 61 can obtain road information from the map database 53. On the other hand, the ECU 60' runs a program stored in the memory etc., to function as the output control part 62 and the lower limit value setting part 63.

In the fourth embodiment, instead of the ECU 60' of the vehicle 1', a driving plan is generated by the server 80. For this reason, it is possible to reduce the processing load of the ECU 60' and in turn possible to reduce the manufacturing cost of the ECU 60'. Note that, in the fourth embodiment as well, in the same way as the first embodiment, the control routine of the processing for generating a driving plan of FIG. 3A and FIG. 3B and the control routine of the processing for changing a driving mode of FIG. 8 are executed.

Other Embodiments

Above, preferred embodiments of the present invention were explained, but the present invention is not limited to these embodiments and can be corrected and changed in various ways within the language of the claims.

For example, at the exhaust passage 41 of the internal combustion engine 40, two or more catalysts may be provided. Further, the first motor-generator 12 may be a generator not functioning as a motor. Further, the second motor-generator 16 may be a motor not functioning as a generator.

Further, the vehicle 1 is a so-called "series-parallel type" hybrid vehicle. However, the vehicle 1 may be a so-called "series type", "parallel type", or other type of hybrid vehicle. Further, the vehicle 1 need not be a plug-in hybrid vehicle. That is, the battery 20 need not be charged by the outside power source 70.

Further, the above embodiments can be worked combined in any way. For example, the third embodiment can be combined with the second embodiment. If the third embodiment is combined with the second embodiment, in the control routine of FIG. 9, instead of step S303, step 403 of FIG. 10 is performed.

Further, the fourth embodiment can be combined with the second embodiment or the third embodiment. If the fourth embodiment is combined with the second embodiment or the third embodiment, in the second embodiment or the third embodiment, the server 80 functions as the driving plan generating part 61.

REFERENCE SIGNS LIST

1, 1' hybrid vehicle
16 second motor-generator
20 battery
40 internal combustion engine
41 exhaust passage
43 catalyst
60, 60' electronic control unit (ECU)
61 driving plan generating part
62 output control part
63 lower limit value setting part

The invention claimed is:

1. A control device of a hybrid vehicle for controlling a hybrid vehicle comprising an internal combustion engine in which a catalyst is provided in an exhaust passage, a motor, and a battery supplying electric power to the motor and being configured to be charged by output of the internal combustion engine,
the control device of a hybrid vehicle comprising:
an electronic control unit (ECU) configured to:
set in advance a driving mode when the hybrid vehicle is being driven;
control outputs of the internal combustion engine and the motor based on the driving mode; and
set a lower limit value of a state of charge of the battery, wherein
in response to the hybrid vehicle being driven from a departure point through at least one via point to a final destination, the ECU is configured to divide a plurality of routes each having a via point as at least one of a starting point and an end point into pluralities of sections, and set driving modes of all sections of at least one route to an EV mode in which the internal combustion engine is stopped and drive use power is output by only the motor, and the at least one via point is a point where the hybrid vehicle stops and the internal combustion engine is stopped,
in response to an actual state of charge of the battery becoming lower than the lower limit value, the ECU is configured to change the driving mode set by the driving plan generating part so that the actual state of charge is maintained or becomes higher, and
the ECU is configured to lower the lower limit value at an EV route where the driving modes of all of the sections are set to the EV mode, compared with a non-EV route other than the EV route.

2. The control device of a hybrid vehicle according to claim 1, wherein the ECU is configured to lower the lower limit value only at the EV route closest to the final destination.

3. The control device of a hybrid vehicle according to claim 1, wherein the ECU is configured to lower the lower limit value at the EV route only in response to the actual state of charge not reaching a reference value when the driving mode is maintained at the EV mode at the EV route, and the reference value is lower than the lower limit value at the non-EV route.

4. The control device of a hybrid vehicle according to claim 3, wherein the ECU is configured to lower the lower limit value only at the EV route closest to the final destination.

5. A control device of a hybrid vehicle for controlling a hybrid vehicle comprising an internal combustion engine in which a catalyst is provided in an exhaust passage, a motor, and a battery supplying electric power to the motor and being configured to be charged by output of the internal combustion engine, wherein the control device of a hybrid vehicle comprising an electronic control unit (ECU) configured to:

set in advance a driving mode when the hybrid vehicle is being driven;

control outputs of the internal combustion engine and the motor based on the driving mode;

set a lower limit value of a state of charge of the battery;

in response to the hybrid vehicle being driven from a departure point through at least one via point to a final destination, dividing a plurality of routes each having a via point as at least one of a starting point and an end point into pluralities of sections, and setting driving modes of all sections of at least one route to an EV mode in which the internal combustion engine is stopped and drive use power is output by only the motor, and the at least one via point is a point where the hybrid vehicle stops and the internal combustion engine is stopped;

in response to an actual state of charge of the battery becoming lower than the lower limit value, changing the driving mode so that the actual state of charge is maintained or becomes higher; and lower the lower limit value at an EV route where the driving modes of all of the sections are set to the EV mode, compared with a non-EV route other than the EV route.

* * * * *